United States Patent [19]

Iwamatsu

[11] Patent Number: 5,046,107
[45] Date of Patent: Sep. 3, 1991

[54] INPUT LEVEL ADJUSTING CIRCUIT

[75] Inventor: Masayuki Iwamatsu, Hamamatsu, Japan

[73] Assignee: Yamaha Corporation, Hamamatsu, Japan

[21] Appl. No.: 414,580

[22] Filed: Sep. 28, 1989

Related U.S. Application Data

[63] Continuation of Ser. No. 101,856, Sep. 28, 1987, abandoned.

[30] Foreign Application Priority Data

Sep. 30, 1986 [JP] Japan .................................. 61-230140

[51] Int. Cl.$^5$ ............................................. H03G 3/00
[52] U.S. Cl. ...................................... 381/107; 381/109
[58] Field of Search ................. 381/104, 105, 107, 109

[56] References Cited

U.S. PATENT DOCUMENTS

| | | | |
|---|---|---|---|
| 4,285,065 | 8/1981 | Priniski | 455/158 |
| 4,292,467 | 9/1981 | Odlen et al. | 381/101 |
| 4,306,113 | 12/1981 | Morton | 381/58 |
| 4,320,255 | 3/1982 | Hull et al. | 381/109 |
| 4,363,001 | 12/1982 | Suzuki et al. | 381/107 |
| 4,405,836 | 9/1983 | Mayerhoff | 381/103 |
| 4,560,838 | 12/1985 | Meisenheimer | 381/123 |
| 4,731,851 | 3/1988 | Christopher | 381/104 |

Primary Examiner—Forester W. Isen
Attorney, Agent, or Firm—Spensley Horn Jubas & Lubitz

[57] ABSTRACT

An input level adjusting circuit used for an input source switching section in an audio device such as a control amplifier comprises an input selector for selecting one of input signals from plural input sources and outputting the selected signal and also outputting information concerning the selected input signal, a level adjusting circuit connected to this input selector for adjusting the level of the selected input signal, a memory for prestoring input level setting offset amounts which are relative differences in an amount of level adjustment for the plural input sources, and a control circuit responsive to the information concerning the selected input signal applied from the input selector for reading out one of the input level setting offset amounts for the corresponding input source and controlling the level adjusting circuit in accordance with the read out input level setting offset amount. The level adjusting circuit is automatically controlled in response to the selection of the input source to adjust the level of the input signal and thereby maintain a constant output level regardless of difference in the input level.

6 Claims, 17 Drawing Sheets

INPUT LEVEL ADJUSTING CIRCUIT

This is a continuation of copending application Ser. No. 101,856, filed on Sept. 28, 1987, now abandoned.

BACKGROUND OF THE INVENTION

This invention relates to an input level adjusting circuit in a source switching section of a control amplifier or other devices performing switching between plural audio sources and, more particularly, to an input level adjusting circuit capable of automatically adjusting signal levels which differ from one another depending upon input sources by employing a common level adjusting means thereby obviating the necessity for making tone volume adjustment each time the input source is switched.

There is a difference in the level of an output signal between different audio input source devices. In switching the audio input source device in a device such as a control amplifier, a master volume of the device must be adjusted each time such switching is made.

For eliminating this inconvenience, there has been proposed an input level adjusting device in which the amount of adjustment of tone volume is preset for each source in a device such as a control amplifier and, therefore, there does not occur change in the tone volume when the input source has been changed.

In this prior art device, as shown in FIG. 17, level adjusting volumes 2a through 2d are provided for source input terminals 1a through 1d and one of source signals which have been adjusted in the tone volume by the level adjusting volumes 2a through 2d is selected by an input selector 3 and supplied to a post stage circuit.

This prior art input level adjusting device requires a plurality of level adjusting volumes 2a through 2d and these volumes 2a through 2d are normally disposed on the back side of the control amplifier or the like device with resulting difficulty in adjusting these volumes 2a through 2d. Besides, the number of volumes must be increased in proportion to increase in the number of input sources.

It is, therefore, an object of the invention to provide an improved input level adusting circuit which is of a simpler construction.

SUMMARY OF THE INVENTION

The present invention provides an input level adjusting circuit which includes a memory for prestoring input level offset amounts representing relative differences in level for plural input sources. The stored offset amounts are read out in conjunction with the selected input signal to control level adjusting means which control the level of the selected input signal.

According to the invention, by prestoring the amount of adjustment of the input levels, the level adjusting means is automatically controlled in response to selection of the input source to adjust the level of the input source signal so that the tone volume does not change when the input source has been changed.

The input level adjusting circuit according to the invention obviates the necessity for providing a tone volume adjusting means individually for each input source so that the circuit construction is simplified. Besides, an input level offset amount setting operator can be disposed on a front panel of a source selection device such as a control amplifier without causing difficulty in manipulation of the operator, so that operability of the circuit is greatly improved.

BRIEF DESCRIPTION OF THE DRAWINGS

In the accompanying drawings.

DESCRIPTION OF PREFERRED EMBODIMENTS

An embodiment of the invention will now be described with reference to FIGS. 1 through 16.

Figure 1:
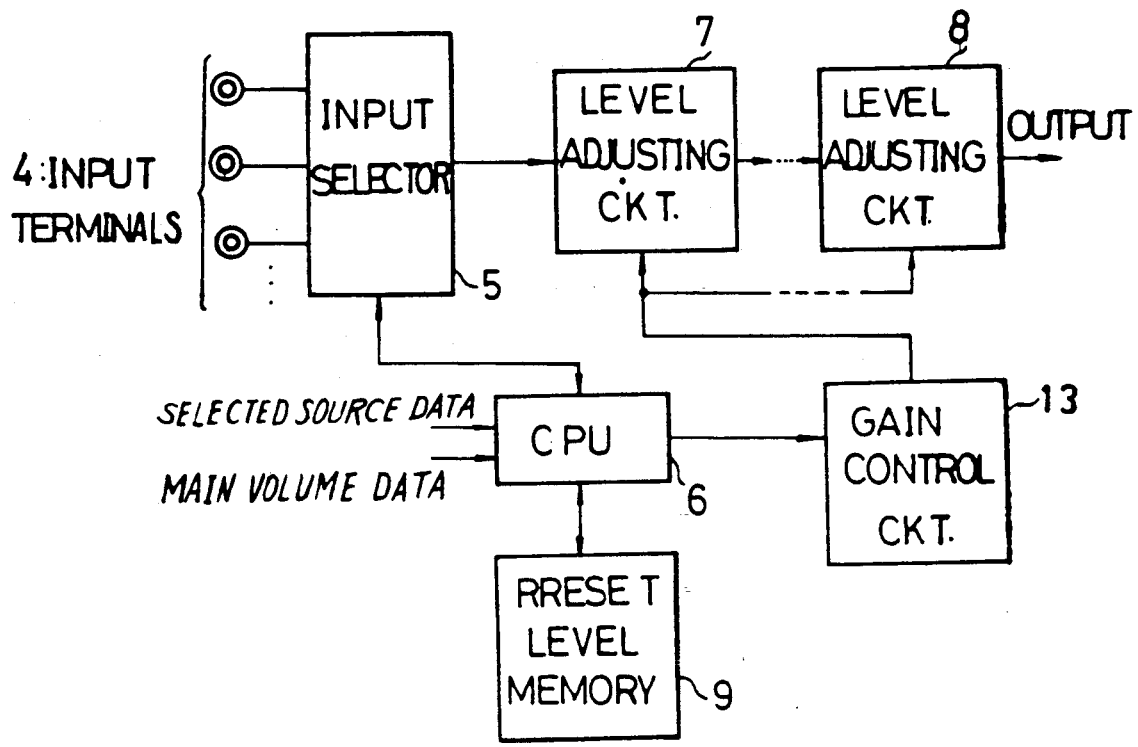
FIG. 1 is a basic block diagram showing an embodiment of the invention.
Figure 17:
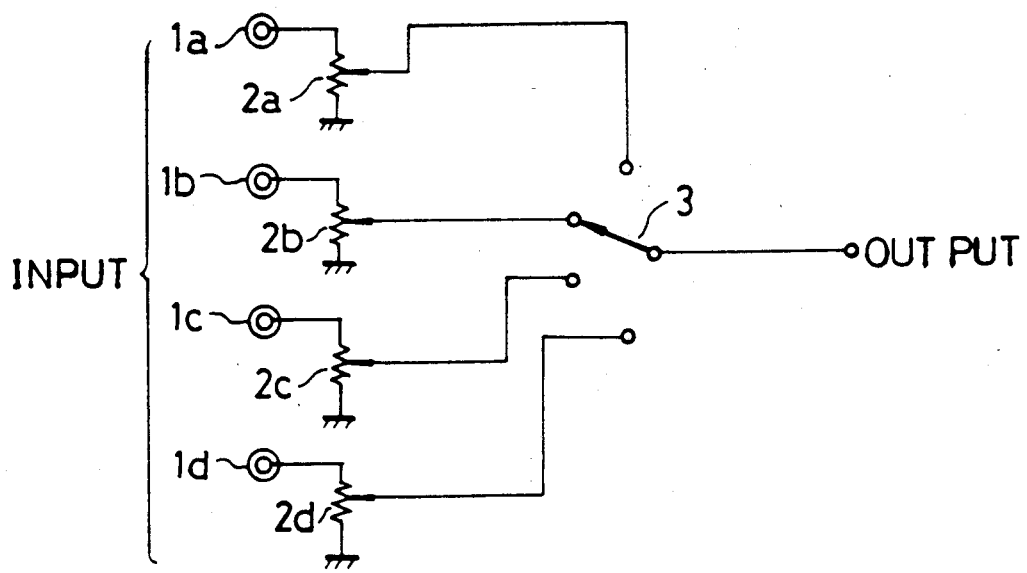
FIG. 17 is a circuit diagram showing the prior art input level adjusting circuit.

In FIG. 1, input signals from respective input sources are applied to source input terminals 4 and supplied to an input selector 5. A CPU 6 causes the input selector 5 to select and output a source signal corresponding to source selection data provided by manipulation of a source selection key. The selected source signal is outputted through level adjusting circuits 7 and 8 consisting of a VCA (in case of an analog input) or a digital volume (in case of a digital input). At this time, the CPU 6 reads out data for the selected source from among input level setting offset amounts (relative differences in an amount of level adjustment) for respective input sources prestored in a preset level memory 9, obtains a level adjusting amount by operating the read out input level setting offset amount and the amount of operation of a main volume and supplies this level adjusting amount to a gain control circuit 13 as a command value. The gain control circuit 13 adjusts gains of the level adjusting circuits 7 and 8 so that outputs from these circuits 7 and 8 will become a level corresponding to the command value. When the level adjusting circuits 7 and 8 consist of VCAs, the gain control circuit 13 is constructed of a digital-to-analog converter and the command value is converted to an analog signal and supplied to the VCAs 7 and 8 as a control voltage in a suitable distribution ratio. According to this arrangement, by prestoring, in the preset level memory 9, offset amounts for compensating for imbalance in the signal level between the respective input sources, a constant output level is obtained when the input source has been changed from one source to another so that the necessity for adjusting the master volume is obviated.

For prestoring the input level setting offset amounts in the preset level memory 9, the following methods can be employed:

(1) A single offset setting operator is provided commonly for the respective input sources in addition to a main tone volume setting operator (main volume). The input source is changed from one input source to another without operating the main tone volume setting operator and the offset setting operator is operated each time the input source is changed so that the output level becomes constant regardless of the input source. The offset amount for each input source determined by the offset setting operator is stored in the preset memory as the input level setting offset amount by depressing a memory key (or, instead of depressing the memory key, causing the offset amount stored automatically upon lapse of a predetermined period of time after completion of operation of the offset setting operator).

(b) Such offset setting operator is not provided but the main tone volume setting operator is operated to obtain the amount of operation of this operator for each input source at which the output level becomes constant regardless of the input source and this amount of operation of the main tone volume setting operator is stored in the preset memory by depressing the memory key or otherwise each time the operation has been completed.

Whichever method is employed, the input level setting offset amount can be renewed as desired.

Figure 8A:
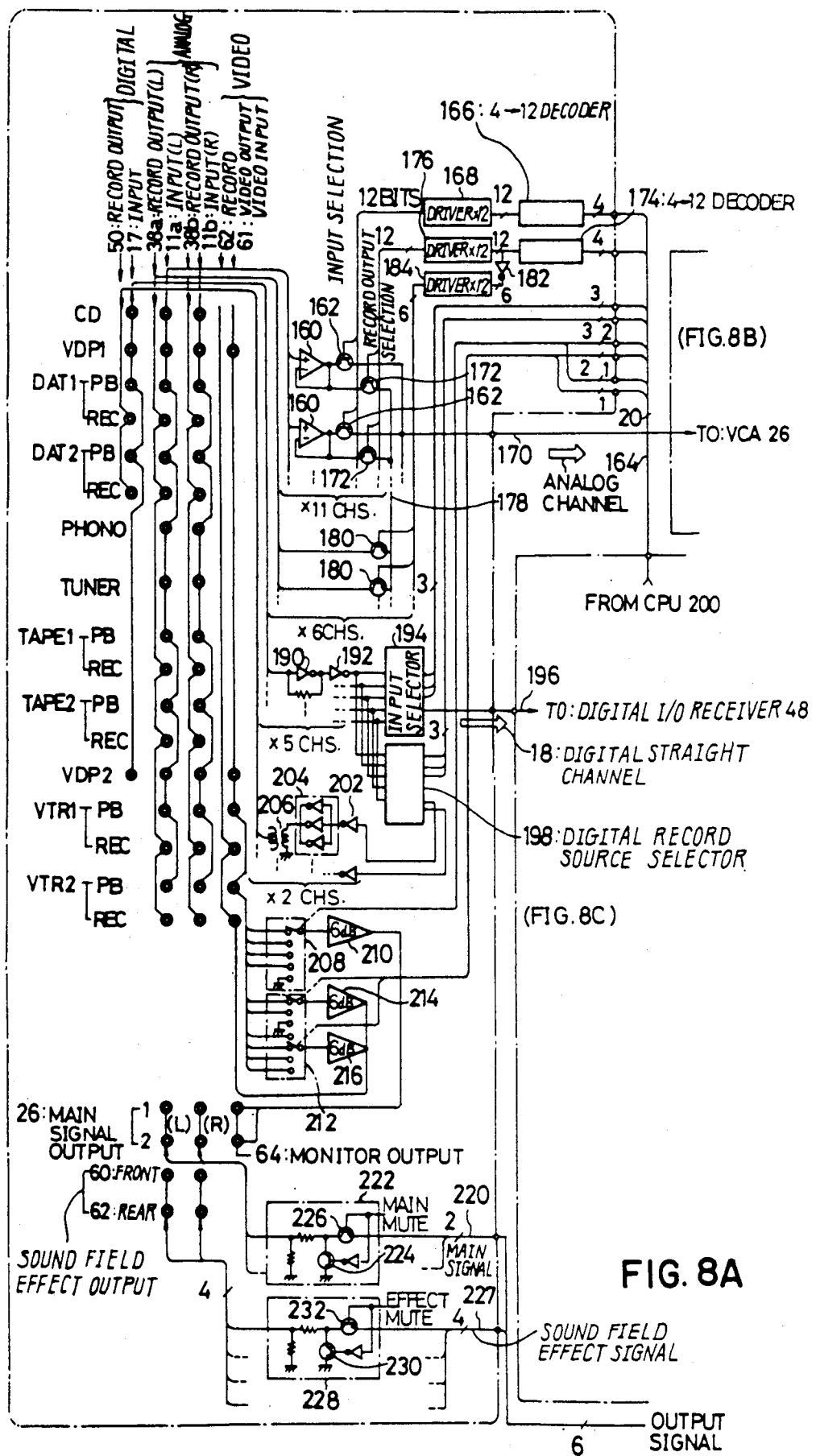
FIGS. 8A, 8B and 8C are views specifically showing portions designated by the same figure numbers in FIG. 2.

An embodiment in which this invention has been applied to a control amplifier will now be described. In this control amplifier, as will be described later, adjustment of the input level is performed by an input level setting key 88 (FIG. 4) provided on a front panel and the set value is stored in a RAM 402 (FIG. 8C). The level adjustment is effected by VCAs 26 and 32, digital volume 49 and digital volumes in digital-to-analog conversion circuits 56 and 58 (FIG. 2) upon comprehensive judgement of factors including the amount of adjustment of the offset setting operator or the main tone volume setting operator.

An outline of this control amplifier will be described with reference to FIG. 2. This control amplifier comprises three channels for supplying a main signal to two main loudspeakers a and b of left and right channels as shown in the plan view of the listening room of FIG. 9 (i.e., an analog straight channel 12, a digital loop 14 and a digital straight channel 18), a sound field effect channel 22 for supplying a sound field effect signal to four sound field effect loudspeakers c, d, e and f of front left, front right, rear left and rear right channels (the loudspeakers c and d may be substituted by the main loudspeakers a and b) and a video signal channel 24 for supplying a video signal to a television monitor g disposed between the main loudspeakers a and b. The respective channels will now be described in detail.

(1) Analog straight channel 12

This channel amplifies a signal of an analog source 10. There are two channels, i.e., left and right channels. This channel is used when controls including a tone control is not performed for the signal of the analog source 10.

The signal of the analog source 10 is applied from an input terminal 11 and is supplied to a main signal output terminal 36 through a VCA 26, an output selection circuit 28 which selects whether the signal should be provided from the analog straight channel 12 or a digital channel 15 (the digital loop 14 or digital straight channel 18), a mode selection circuit 30 which selects a stereophonic output or a monaural output), a VCA 32 and a buffer amplifier 34.

The main signal output terminal 36 (2 channels, left and right) is connected to a main signal left and right input terminal of a power amplifier (not shown).

The signal from the analog source 10 is supplied as a record source signal to analog record output terminals 38.

(2) Digital loop 14

This channel converts a signal of the analog source 10 to a digital signal and then converts it to an analog signal again after applying a digital signal processing such as a tone control to the digital signal and outputs the analog signal. This channel is used when controls such as a tone control is performed for the signal from the analog source 10.

The signal from the analog source 10 is supplied to an analog-to-digital converter 40 including a dither circuit through the VCA 26 and converted to a digital signal. Then the converted signal is supplied to a digital equalizer 42. The digital equalizer 42 constructed of a three-band parametric equalizer which is a digital equalizing processor having band-pass characteristics and is capable of setting a center frequency, Q and level as desired with respect to each divided band. The digital equalizer 42 is also capable of freely setting low cut and high cut frequencies for and gradients of the slopes of the cut-off frequencies (rate of attenuation).

The output which has been subjected to the tone control in the digital equalizer 42 is supplied to a main signal output terminal 36 through a quadruple oversampling digital filter 44, a digital-to-analog conversion circuit 46, the output selection circuit 28, the mode selection circuit 30, the VCA 32 and the buffer amplifier 34.

(3) Digital straight channel 18

In this channel, a signal from a digital source 16 is applied from an input terminal 17 and, after being subjected to a digital signal processing, is converted to an analog signal and thereafter is outputted.

A signal from the digital source 16 is applied to a digital I/O receiver 48. The digital I/O receiver 48 is a circuit interfacing the signal from the digital source 16 with the post stage circuit. This digital I/O receiver 48 has an internal PLL circuit and automatically follows the sampling frequency of the digital source 16 (e.g., 44.1 kHz in the case of Compact Disc and 48 kHz in the case of DAT (digital audio tape recorder)), thereby performing functions including detection of presence or absence of the digital source 16 and presence or absence of an error (parity check) and outputting subcode.

In a case where signals have been applied both in analog and in digital from the same input source (e.g., CD, DAT and VDP), the digital I/O receiver 48 automatically selects the signal from the digital source 16 which is of a higher quality and provides this signal to the digital equalizer 42 while the receiver 48 shuts off the digital loop 14 of the analog source 10. Owing to this arrangement, even if a digital processing circuit (e.g., a digital-to-analog converter) provided in the CD or DAT or the like which constitutes the input source is of poor characteristics, the high precision digital processing circuit in the control amplifier can be employed without employing the digital processing circuit in the input source whereby an final analog output of a high quality can be obtained.

The digital signal received by the digital I/O receiver 48 is supplied to the main signal output terminal 36 through a digital volume 49, the digital equalizer 42, the quadruple oversampling digital filter 44, the digital-to-analog conversion circuit 46, the output selection circuit 28, the mode selection circuit 30, the VCA 32 and the buffer amplifier 34.

The signal from the digital source 16 is supplied as a record source signal to digital record output terminals 50.

Summing up, the three main signal channels 12, 14 and 18 are used in the following manner:

| signal of input source | State of digital equalizer 42 | |
|---|---|---|
| | ON | OFF flat characteristics |
| analog only | digital loop 14 | analog straight channel 12 |
| digital only | digital straight channel 18 | digital straight channel 18 |
| both analog and digital | digital straight channel 18 | digital straight channel 18 |

(4) Sound field effect channel 22

In this channel, a digitallized source signal is applied to a sound field processor 20 to create a sound field effect tone signal and this signal is converted to an analog signal and is outputted.

Figure 3:
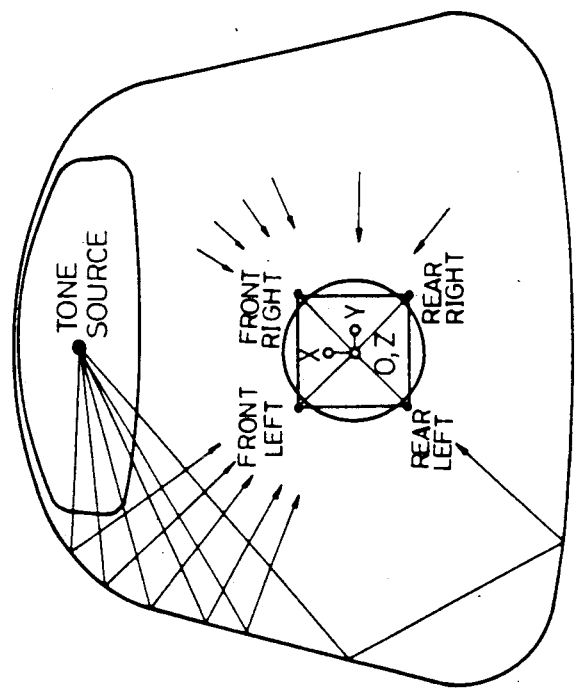
FIG. 3 is a diagram showing the principle of the sound field effect system which is incorporated in the control amplifier shown in the embodiment.

This sound field effect is obtained by, as shown in FIG. 3, issuing an impulse signal from a stage of an actual hall, church, studio or other environment, catching multiple initial reflected sound waves arriving from four directions to a listening point by a four-point (i.e., four-channel) microphone placed at a listener's seat, storing, by a digital processing, hypothetical tone source distribution on the basis of data collected by the microphone with respect to each direction in which the reflected sound waves have arrived, reading out the stored data in the reproduction mode and combining it with a source signal thereby to reproduce a sound field which is analogous to one which was measured and stored. This sound field effect system is disclosed in the specification of Japanese Patent Application No. 99244/1985.

Figure 9:
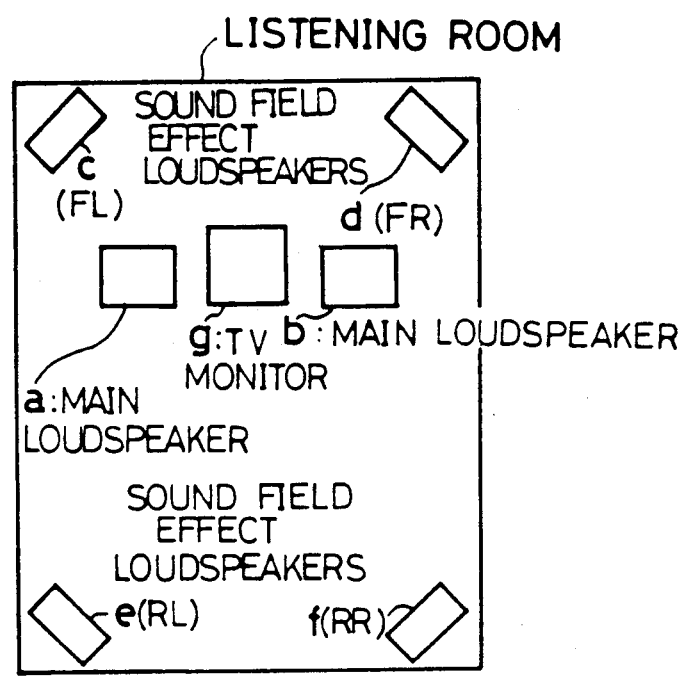
FIG. 9 is a plan view showing disposition of devices including loudspeakers in a listening room to which the control amplifier shown in this embodiment is applied.

The feature of this system is that the reflected sound is not issued in only a direction in which the loudspeaker is disposed as in a conventional processor but directions, amounts of delay and levels of multiple reflected sounds are simulated in three-dimentional space by using four loudspeakers (c, d, e and f in FIG. 9). For this purpose, the four loudspeakers c, d, e and f are disposed at four corners of a listening room.

Accordingly, the sound field processor 20 does not produce a sound field pattern by utilizing components contained in the source signal but selects and applies one of previously stored, ready-made sound field patterns which is most closely simulating a desired sound field. If, for example, 88 different data (22 for each loudspeaker) are stored as initial reflected waves, sound fields simulating various environments such as a hall can be realized in a listening room with high fidelity.

In the sound field processor 20, a sound field effect tone is created by performing a convolution operation with an output from the digital equalizer 42 in accordance with one program which has been selected by the user from among sixteen factory programs which have been prestored in the memory as initial reflected tone data for the sound field effect purpose and sixteen user programs which have been prepared by the user by changing the parameters of the factory programs. Signals for the front loudspeakers and ones for the rear loudspeakers are outputted from sound field effect tone output terminals 60 and 62 through quadruple oversampling digital filters 52 and 54 and digital-to-analog conversion circuits 56 and 58 with digital volumes (as to the left and right channels, the signals are processed on a time shared basis). The sound field effect tone output terminals 60 and 62 are connected to sound field effect input terminals (four channels) of a power amplifier.

This sound field effect channel 22 performs its function even when the digital equalizer 42 is off (i.e., a sound field effect signal with a flat characteristic is produced).

(5) Video signal channel 24

In this channel, a signal from a video source 60 is applied to an input terminal 61 and supplied directly to recorded video outputs 62 and a monitor output 64.

Figure 2:
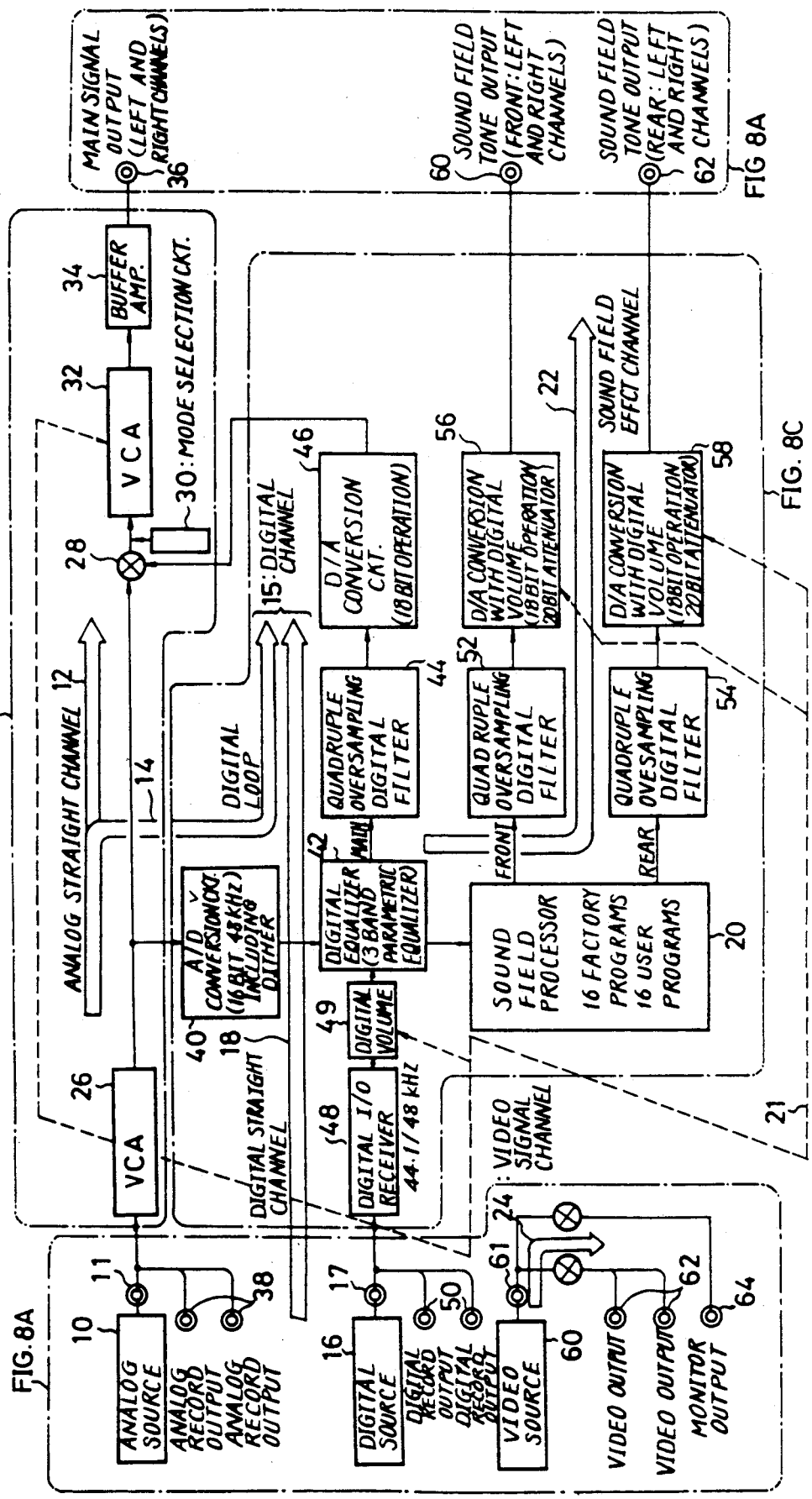
FIG. 2 is a block diagram showing an embodiment of a control amplifier to which the invention has been applied, the diagram showing an outline of a specific circuit shown in FIGS. 8A, 8B and 8C.
Figure 10:
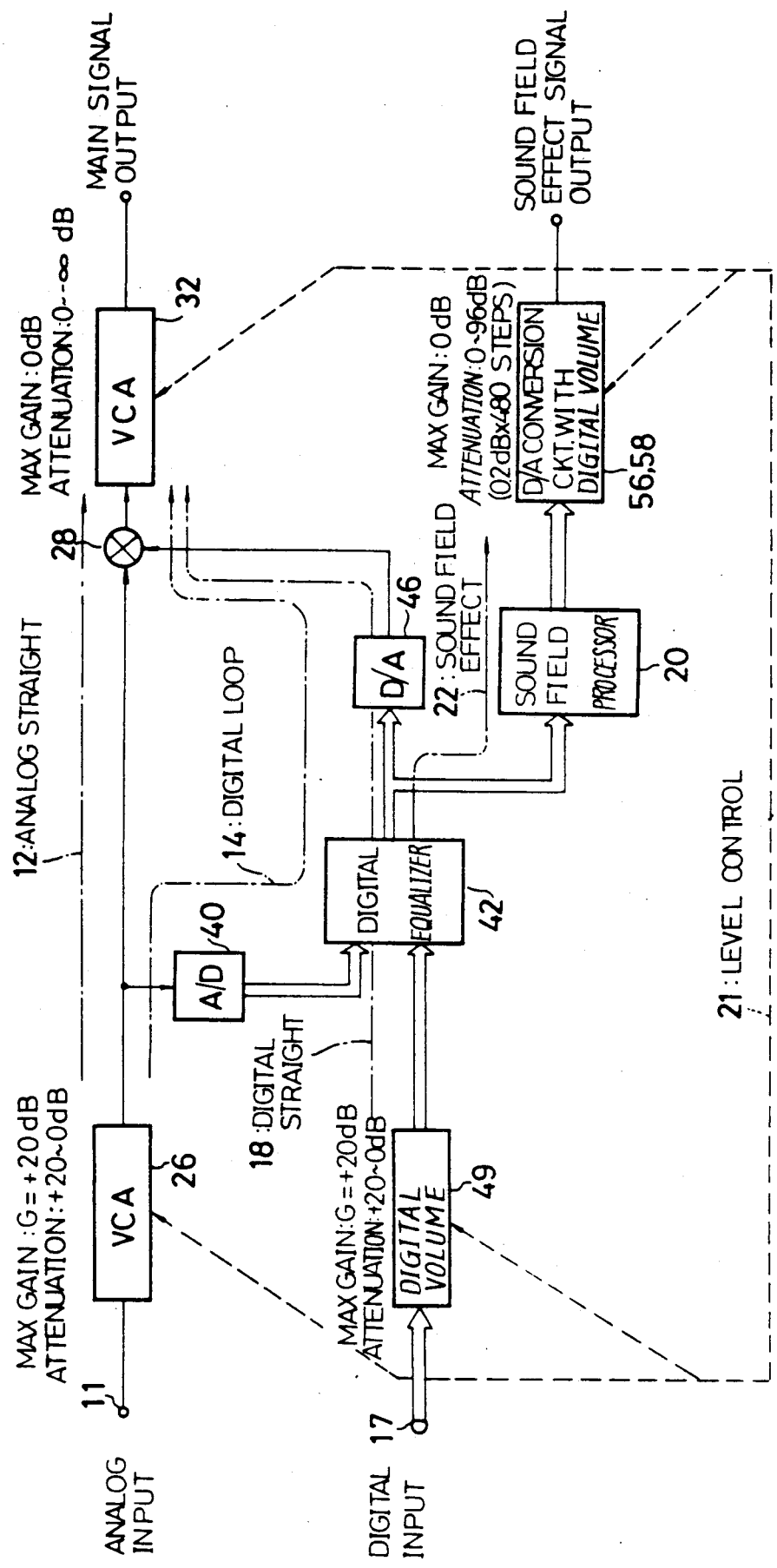
FIG. 10 is a block diagram showing gain distribution in the control amplifier in this embodiment.

FIG. 10 shows gain distribution in the tone volume adjustment in the control amplifier of FIG. 2. Explanation will now be made with respect to each channel.

(1) Analog straight channel 12 and digital loop 14

A total gain between the input and the output is provided by VCA 26+VCA 32. The VCA 26 has a gain of maximum gain +20 dB as rated gain G of the analog straight channel 12 and the digital loop 14 and this gain is attenuated within the range between +20 dB and 0 dB.

The VCA 32 has a maximum gain of 0 dB and this gain is attenuated within the range between 0 dB and $-\infty$ dB.

Figure 11:
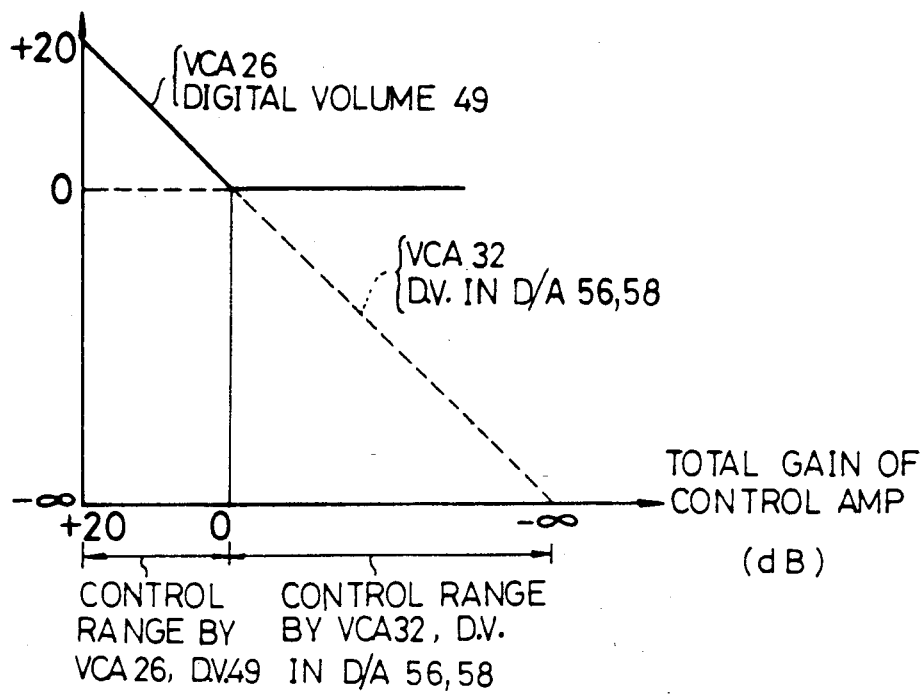
FIG. 11 is a diagram for explaining the gain distribution shown in FIG. 10.
Figure 12:
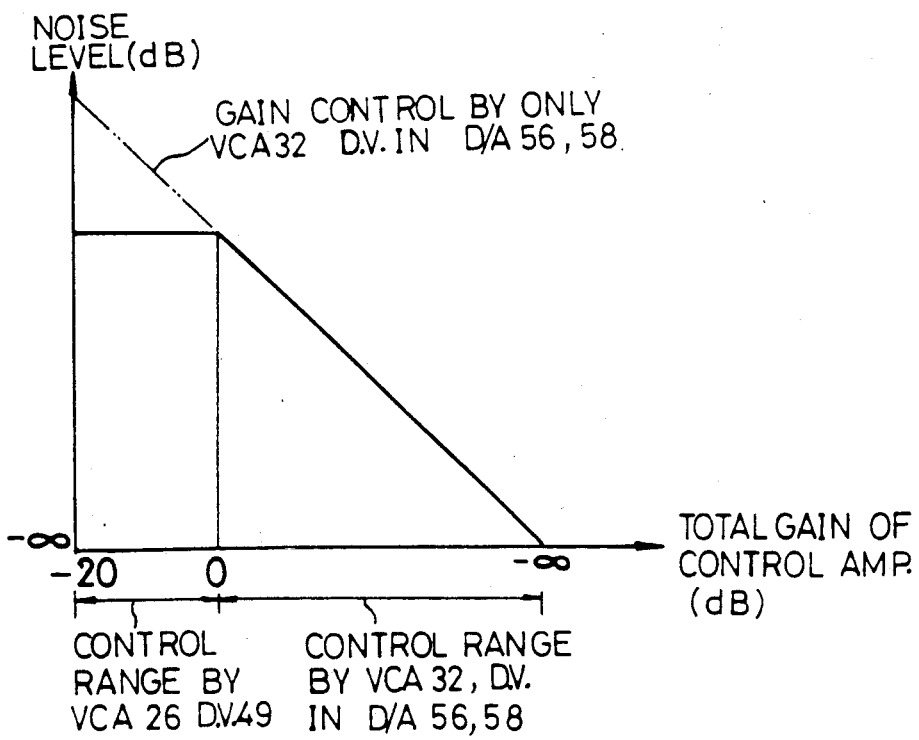
FIG. 12 is a diagram showing noise level caused by the gain distribution in FIG. 10.

As shown in FIG. 11, the VCA 26 is operated and the VCA 32 is not operated (i.e., no gain) in the total gain range between +20 dB (maximum tone volume) and 0 dB (no gain between the input and the output). In the total gain range between 0 dB and $-\infty$ dB, the VCA 26 is not operated and the VCA 32 is operated. Accordingly, in the digital loop 14, as shown in FIG. 12, in a case where the tone volume is set at a large value (total gain being +20 dB through 0 dB), residual noises in the analog-to-digital conversion circuit 40 (quantizing noise in analog-to-digital conversion) and the digital-to-analog conversion circuit 46 (error noise in digital-to-analog conversion) do not increase for there is no gain in their post stage circuit.

In a case where the tone volume has been set at a small value (total gain being 0 dB through $-\infty$ dB), a signal is applied at 0 dB to the digital processing circuits (i.e., the analog-to-digital conversion circuit 40, the digital-equalizer 42, the digital-to-analog conversion circuit 46) so that possible occurrence of residual noise in the digital processing circuits does not adversely affect S/N. Further, since the attenuation takes place in the post stage circuit of the digital processing circuits, the level of the residual noise has been attenuated when the residual noise is outputted.

(2) Digital straight channel 18

A total gain between the input and the output is provided by the digital volume 49 and the VCA 32. The digital volume 49 has a maximum gain of +20 dB as rated gain G and is attenuated within the range between +20 dB and 0 dB.

The VCA 32 has, as described above, a maximum gain of 0 dB and is attenuated within the range between 0 dB and $-\infty$ dB.

As shown in FIG. 11, the digital volume 49 is operated and the VCA 32 is not operated (no gain) in the total gain range between +20 dB (maximum tone volume) and 0 dB (no gain between the input and the output). In the total gain range between 0 dB and $-\infty$ dB, the digital volume 49 is not operated and the VCA 32 is operated.

Accordingly, in a case where the tone volume has been set at a large value in the digital straight channel 18 (total gain being +20 dB through 0 dB), residual noises in the digital equalizer 42 (quanitzing noise in analog-to-digital conversion) and the digital-to-analog conversion circuit 46 (error noise in digital-to-analog conversion) do not increase for there is no gain in their post stage circuits.

In a case where the tone volume has been set at a small value (total gain being 0 dB through $-\infty$ dB), a signal is applied at 0 dB to the digital equalizer 42 and the digital-to-analog conversion circuit 46 so that possible residual noises occurring in these circuits 42 and 46 do not adversely affect S/N. Further, since the attenuation takes place in the post stage circuits of these circuits 42 and 46, the level of the residual noise has been attenuated when the residual noise is outputted.

(3) Sound field effect channel 22

In the case of the analog source 10, a total gain between the input and the output is provided by the VCA 26 + digital volumes of the digital-to-analog conversion circuits 56 and 58 whereas in the case of the digital source 16, a total gain between the input and the output is provided by the digital volume 49 + digital volumes of the digital-to-analog conversion circuits 56 and 58. The VCA 26 or the digital volume 49 has a maximum gain of +20 dB as rated gain G of this channel 22 and its gain is attenuated within the range of +20 dB and 0 dB.

The digital volumes of the digital-to-analog conversion circuits 56 and 58 have a maximum gain of 0 dB and this gain is attenuated within the range of 0 dB and $-96$ dB.

As shown in FIG. 11, the VCA 26 or the digital volume 49 is operated and the digital volumes of the digital-to-analog conversion circuits 56 and 58 are not operated (no gain) in the total gain range between +20 dB (maximum volume) and 0 dB (no gain between the input and the output). In the total gain range smaller than 0 dB, the VCA 26 or the digital volume 49 is not operated and the digital volumes of the digital-to-analog conversion circuits 56 and 58 are operated.

The total gain of each channel is computed by a microcomputer upon comprehensive judgement of the amounts of adjustment in various tone volume adjustment operations including a main volume, left and right balance volume, audio muting, input level adjustment (all of these adjustments affecting the main and sound field effect signals), main signal muting ( affecting the main signal only), sound field effect signal muting, sound field effect front and rear balance and sound field effect signal level (affecting the sound field effect signal only). The microcomputer determines the gain distribution among the respective tone volume adjustment control circuits (i.e., VCAs 26 and 32, digital volume 49 and digital-to-analog conversion circuits 56 and 58) and controls the respective gains so that the total gain will be obtained.

The control amplifier of FIG. 2 described above will now be described more fully below.

Figure 4A:
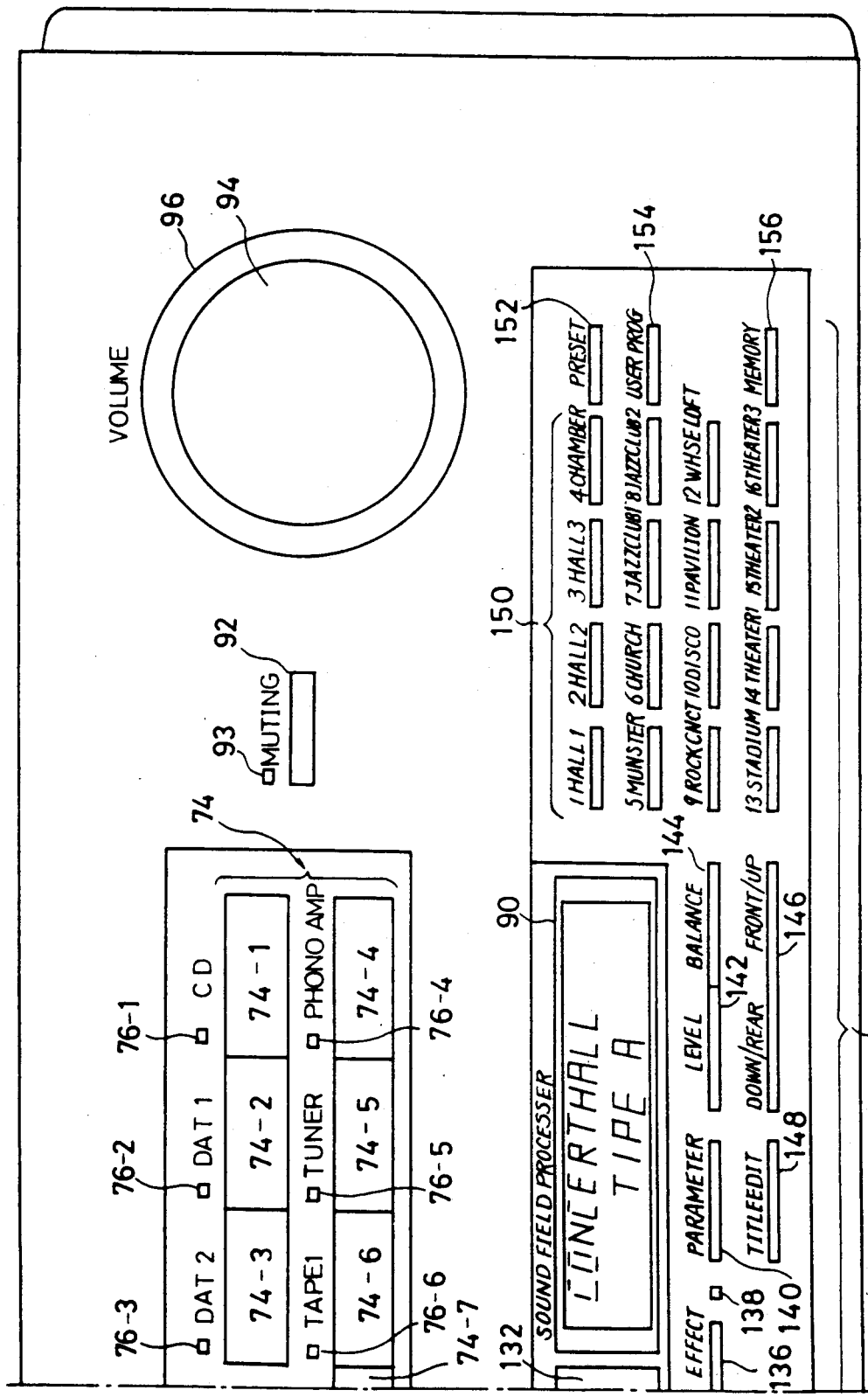
FIGS. 4A and 4B are a front view of a front panel of the control amplifier shown in the embodiment.
Figure 4B:
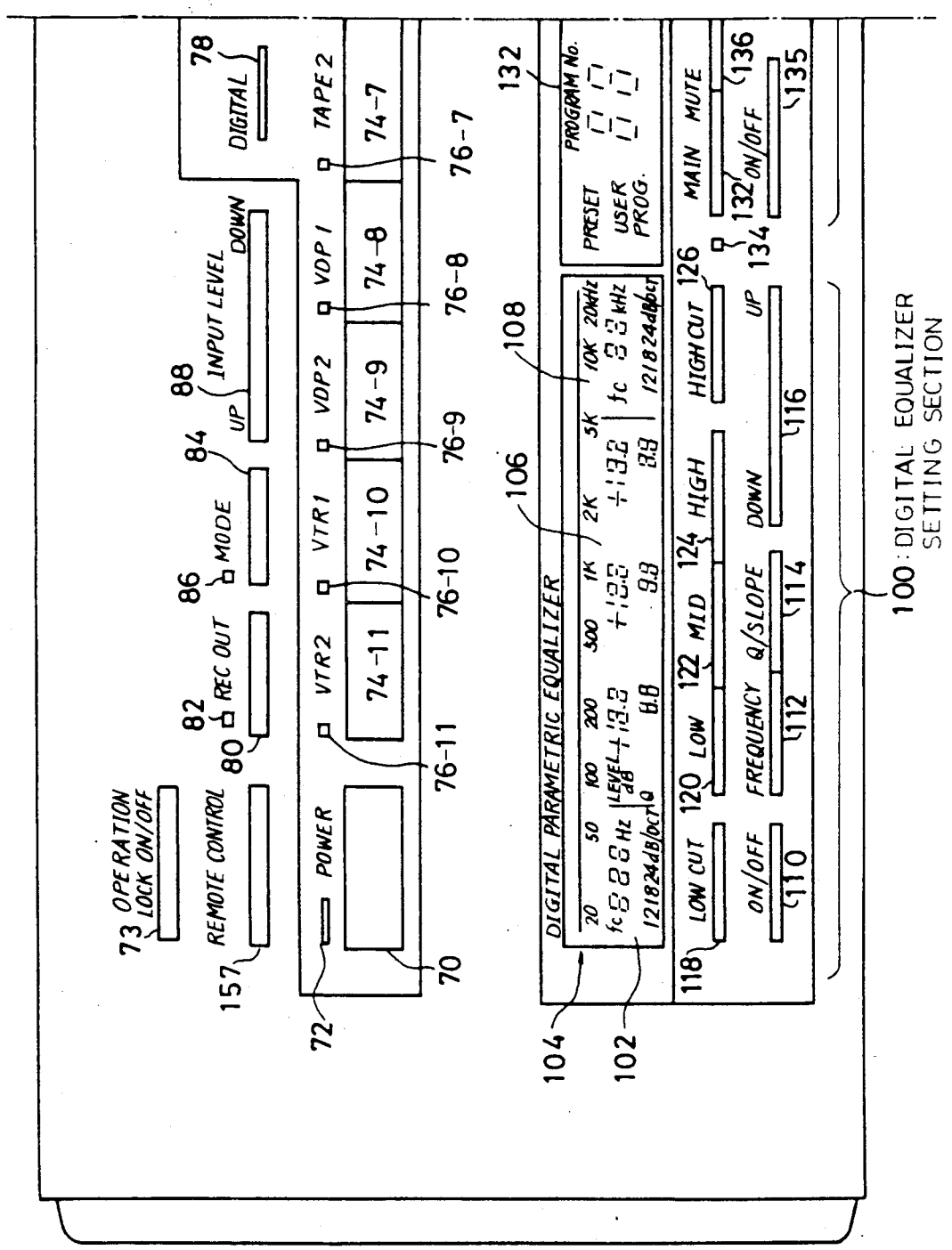

FIG. 4 shows a front panel of the control amplifier of FIG. 2. Each section of the front panel will be described below.

(1) Power switch

This is a power switch of this control amplifier. When this switch 70 is ON, an LED (light-emitting diode) indicator 72 is lighted. Upon turning on of the power switch 70, the respective portions of this control amplifier are brought into a set state before power-off.

(2) Operation lock on-off key 73

This is a key for enabling or disabling parameter setting operations in the digital equalizer 42 and the sound field processor 20 by a front panel key. When this key is ON, the parameter setting operations are disabled (provided, however, that a parameter setting operation by remote-control operation is accepted). By using this key, the user can prevent undesired change in a set value by operation of a key on the front panel by, e.g., a child playing with the key. When the key 73 is OFF, the paremeter setting operation is released from the locked state and the parameters can be set by operating the keys in the front panel (setting of the parameters by remote-control is also possible).

(3) Input selector 74

This is a selector for selecting an input source connected to this control amplifier. The input selector has selector keys 74-1 through 74-11 all of which are made of tact switches. By pushing these selector keys 74-1 through 74-11, the following input sources are respectively selected:

74-1: Compact Disc player (CD)
74-2: digital audio tape recorder 1 (DAT 1)
74-3: digital audio tape recorder 2 (DAT 2)
74-4: record player (PHONO AMP)
74-5: tuner (TUNER)
74-6: analog audio tape recorder 1 (TAPE 1)
74-7: analog audio tape recorder 2 (TAPE 2)
74-8: video disc player 1 (VDP 1)
74-9: video disc player 2 (VDP 2)
74-10: video tape recorder 1 (VTR 1)

74-11: video tape recorder 2 (VTR 2)

LED indicators 76-1 through 76-11 are provided adjacent to the respective input selector keys 74-1 through 74-11 so that one of the LED indicators 76-1 through 76-11 corresponding to the selected input source is lighted green. When the signal of the selected input source is a digital signal, an LED indicator 78 is lighted to indicate that a digital sigal is being applied.

(4) Record out key 80

This is a key for outputting a signal from the input source as a record source signal to the respective recording devices (DAT 1, DAT 2, TAPE 1, TAPE 2, VTR 1 and VTR 2) connected to this control amplifier. Upon turning on of this key 80, an LED indicator 82 is lighted intermittently for 5 seconds. By an operation performed during the period of 5 seconds, the following operation modes are established:

(a) If the input selector 74 is operated within the period when the LED indicator 82 is intermittently lighted, a signal of the input source corresponding to the depressed key is supplied to the selected recording device (the signal is not supplied to the selected input source itself). Accordingly, the signal of this input source can be recorded by recording operation performed on the recording device side. At this time, one of the LED indicators 76-1 through 76-11 corresponding to the input source which has been selected by the input selector 74 is lighted red (the LED indicators 76-1 through 76-11 consist of LEDs having two colors of green and red) to show that the signal from this input source is being outputted as the record source signal.

An input source used for normal playing back from a loudspeaker and an input source used for a recording signal can be selected independently from each other so that a signal from one input source can be recorded in a recording device while listening to a signal fom another input source.

(b) If the record out key 80 is depressed again without operating the input selector key 74, the outputting of the record source signal is stopped and the record source signal is not supplied to any recording device. The LED indicator (one of 76-1 through 76-11) which has been lighted red is turned off.

(c) If neither the input selector 74 nor the record out key 80 is operated within the 5 second period during which the record out LED indicator 82 is intermittently lighted, the input source which was lastly selected as the record source signal before the 5 second period is supplied to the respective recording devices again and one of the LED indicators 76-1 through 76-11 corresponding to this input source is lighted red. This arrangement is made for enabling selection of the signal from the same input source as was selected last time without manipulating the input selector 74 in case the user wishes to record such same signal thereby to simplify the selection of the record source signal.

(5) Mode key 84

This is a key for selecting whether the main signal should be provided as a stereophonic output or a monaural output. When the monaural output has been selected, an LED indicator 86 is lighted.

(6) Input level setting key 88

Although the level of the source signal differs for each input source, adjusting of tone volume by a master volume each time the input source has been changed will not be necessary if ratio of tone volume among the respective input sources is previously adjusted in the control amplifier. The input level setting key 88 is provided for this purpose. The key 88 is constructed of a see-saw type switch.

Figure 5:
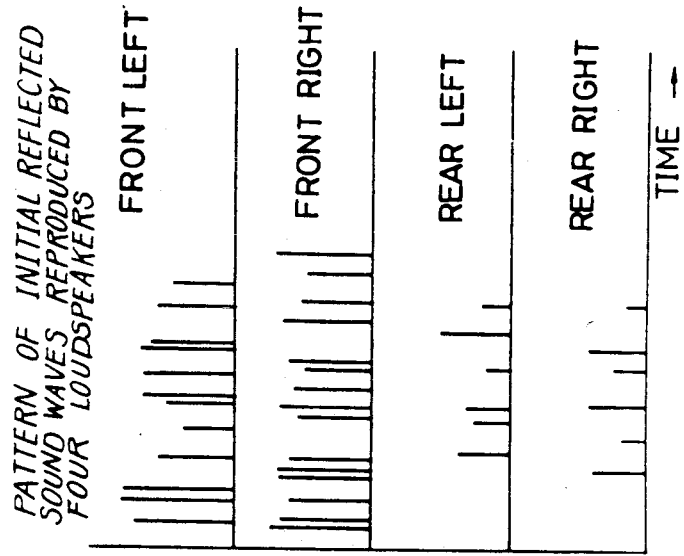
FIG. 5 is a front view of an example of display in a display section 90 in the front panel shown in FIG. 4 (4A)
Figure 5:
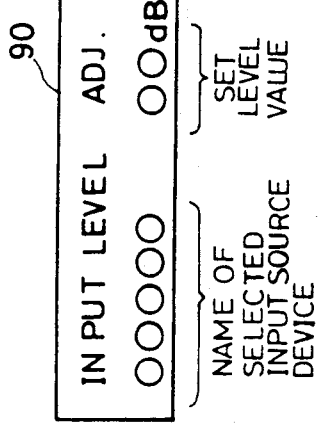

If the input level setting key 88 is depressed on its left side in a state in which an input source has been selected by the input selector 74, the tone volume increases whereas if the key 88 is depressed on its right side, the tone volume decreases. The tone volume changes with a step of 0.2 dB from an initial value of 0 dB within the range between 0 dB and −6 dB. At this time, the fact that the input level setting operation is being performed, the name of the input source being set and the set level value are displayed on a 16-row 2-line LCD (liquid crystal display) 90 as shown in FIG. 5 and the set level value is stored in real time in a memory. The stored set value is maintained even after the power switch 70 is turned off. Upon release of the input level setting key 88, the input level setting mode is cleared after five seconds.

If the input source has been selected by the input selector 74, the input level which has been set for this input source is read out to control the VCAs 26 and 32 and digital volumes of the digital-to-analog conversion circuits 56 and 58 of the respective tone volume adjustment control circuits of FIG. 2 and thereby establish offset of a main volume 94 and correct difference in the level of the source signal for each input source.

By this arrangement, the level of each input source can be adjusted to the same level without adjusting the main volume 94 irrespective of the input source which is changed by the input selector 74.

(7) Muting key 92

This is an audio muting key for attenuating the tone volume by −20 dB.

When the muting key 92 is ON, an LED indicator 93 is lighted red. When the muting key 92 is ON, the respective tone volume adjustment control circuits are controlled to effect audio muting.

When the selection by the input selector 74 has been switched from one input source to another, this audio muting is automatically performed for 0.2 second to fade out the input source before the switching and fade in the input source after the switching thereby preventing generation of noise at the switching of the input source.

(8) Main volume 94

This volume has a variable resistor which divides DC voltage. The value of DC voltage provided by this variable resistor changes in accordance with the amount of rotation of the variable resistor. This voltage value is converted to a digital value by an analog-to-digital converter and the amount of rotation is converted to dB value by a microcomputer. This dB value is then operated with the set amounts of other tone volume adjusting means (i.e., balance adjusting volume 96, muting key 92 and input level set amount by the input level setting key 88) to obtain the total gain. The gain distribution for the respective tone volume adjustment control circuits (VCAs 26 and 32, digital volume 49 and digital volumes of the digital-to-analog conversion circuits 56 and 58) is calculated from this total gain. The dB value is converted to a control voltage Vc for the VCAs and to a step signal for controlling the digital volumes to control the gain of the respective tone volume adjustment control circuits and thereby adjust the tone volume.

A motor (not shown) is connected to the main volume 94 and the tone volume control can be performed by remote control also.

(9) Balance adjusting volume 96

This is a volume for adjusting balance between the main signals between the left and right channels and balance between the sound field effect signals of the left and right channels. The amount of adjustment is processed by the microcomputer after analog-to-digital conversion and is used to control the respective tone volume adjustment control circuits for balancing between the left and right channels.

(10) Digital equalizer parameter setting section 100

Figure 6:
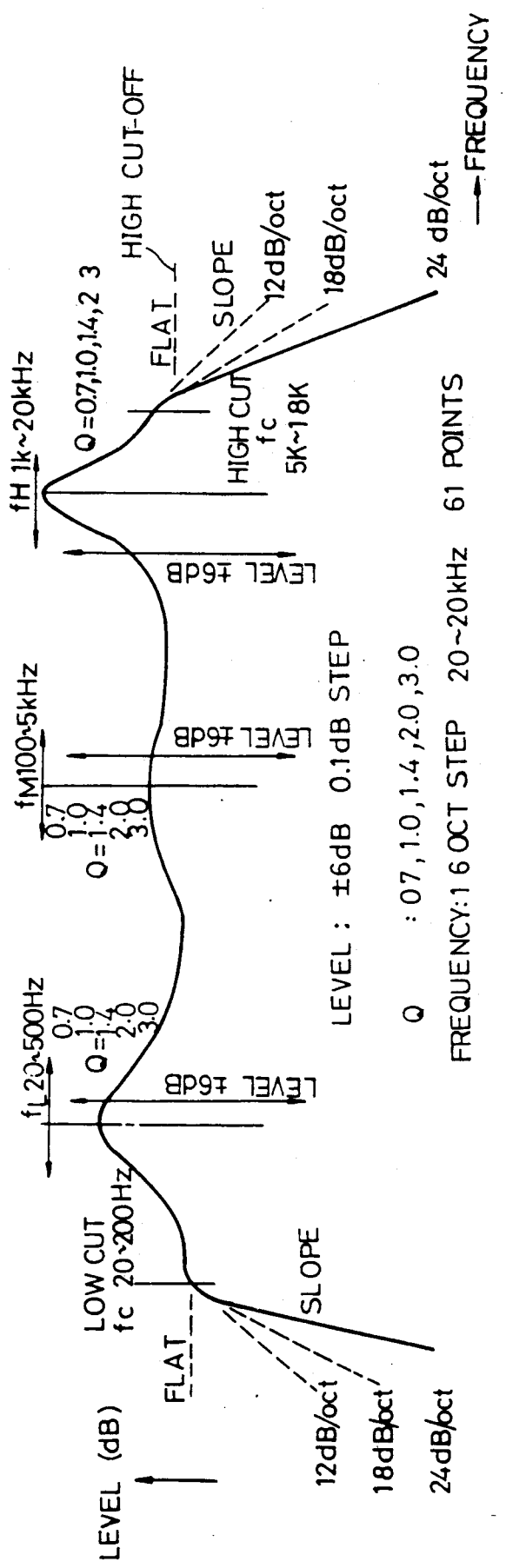
FIG. 6 is a graph showing an example of filter characteristics of a digital equalizer 42 established by a digital equalizer parameter setting section 100 in the front panel shown in FIG. 4 (4B)

This is a section performing setting of parameters of the digital equalizer 42 (FIG. 2). In this section, as shown in FIG. 6, the frequency band can be divided in three bands of low, middle and high frequency bands and center frequencies $f_L$, $f_M$ and $f_H$, level and Q can be set. Further, low cut and high cut cut-off frequencies $f_C$ and slopes can also be set.

The center frequencies $f_L$, $f_M$ and $f_H$ of the respective bands can be set with the following frequency ranges with 1/6 oct step:

$f_L$: 20-500 Hz
$f_M$: 100-5 kHz
$f_H$: 1-20 kHz

The setting of the center frequencies is made under the condition $f_L < f_M < f_H$.

The level for the respective bands is set within the range between $-6$ dB and $+6$ dB with a step of 0.1 dB.

Q for the respective bands is set to either one of 0.7, 1.0, 1.4, 2.0 and 3.0.

The cut-off frequencies f at the low cut and high cut set respectively within the ranges of 20-200 Hz and 5k-18 kHz and the gradients of their slopes are set to either 12 dB/oct, 18 dB/oct or 24 dB/oct.

Figure 7:
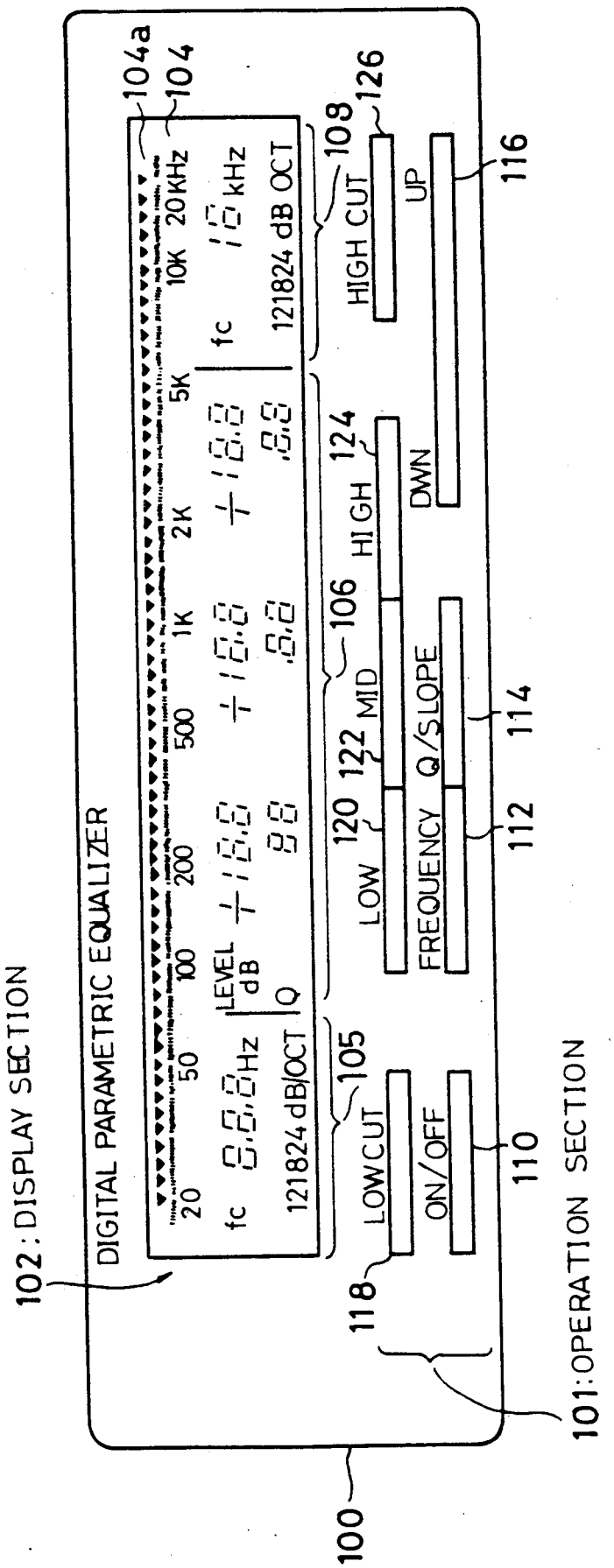
FIG. 7 is an enlarged view of the digital equalizer parameter setting section 100 in the front panel in FIG. 4 (4B)

FIG. 7 is an enlarged view of the digital equalizer parameter setting section 100. This parameter setting section 100 has an operation section 101 in the lower part thereof and a display section 102 in the upper portion thereof.

The display section 102 displays set values of the respective parameters and is constructed of an LCD with backlight. This display section 102 displays the respective center frequencies $f_L$, $f_M$ and $f_H$ among the parameters of the three frequency bands in graphic representation on a scale and displays the level and Q in numerical representation. If all of the frequency characteristics are graphically represented, an enormous amount of computation would be required. For avoiding such enormous amount of computation, the above construction has been adopted having regard to the following points:

(1) As to the center frequencies, since the frequency is divided into three frequency bands, graphical representation of the center frequencies on a scale is preferable for understanding relative locations of these center frequencies.

(2) Since the level has been conventionally indicated in numerical representation, the numerical representation of the level will be readily understood.

(3) Q is generally hard to understand so that it will suffice for the purpose of representing the frequency characteristics if Q can be recognized in some way.

Owing to the construction of the display section 102, frequency control characteristics display which are easy to use and understand can be performed in a simple manner.

In the display section 102, a frequency scale 104 is provided in the upper portion thereof for displaying the center frequencies $f_L$, $f_M$ and $f_H$ of the respective bands. The locations of the set center frequencies $f_L$, $f_M$ and $f_H$ are represented in three of black triangles 104a arranged in a line above the scale 104.

As to the numerical representation, in a left section 105, the low cut frequency is displayed in the upper line and its slope (either 12 dB/oct, 18 dB/oct or 24 dB/oct) is displayed in the lower line. In a central section 106, the level is displayed in the upper line and Q is displayed in the lower line with respect to the low, middle and high frequency bands from the left. In a right section 108, the high cut frequency is displayed in the upper line and its slope (either 12 dB/oct, 18 dB/oct or 24 dB/oct) is displayed in the lower line.

The operation section 101 has the following keys for setting the parameters, each key being constructed of a tact switch:

(1) Equalizer on-off key 110

This is a key for turning on and off the function of the digital equalizer 42. If this key 110 is turned off, the characteristics of the digital equalizer 42 becomes flat. Further, if the key 110 is turned off when an input signal from the analog source 10 is applied, the analog straight channel 12 is employed as the channel for the main signal (FIG. 2).

Figure 16:
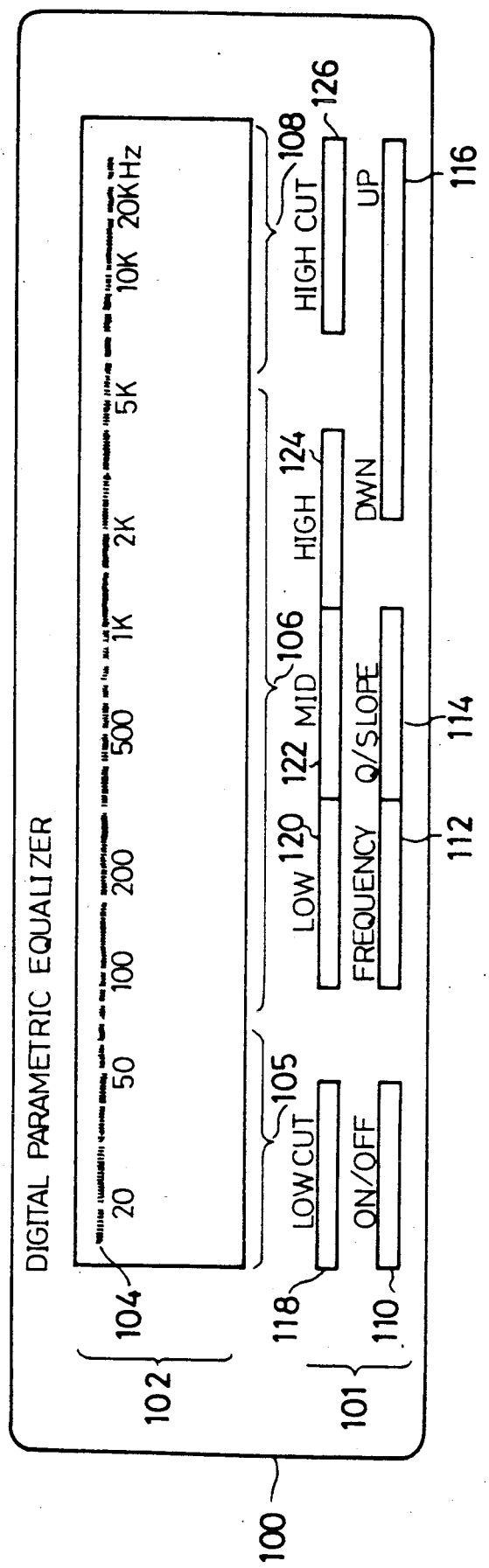
FIG. 16 is a diagram showing a state of display in the digital equalizer parameter setting section 100 when an equalizer on-off key 110 in the control amplifier shown in the embodiment has been turned off.

Despite turning off of the key 110, the values of the parameters before the turning off of the key 110 are maintained in the memory. If this key 110 is turned off when the sound field processor 20 is OFF (by operation of a sound field effect on-off key 135 (FIG. 4)), displays on the display section 102 disappear and the back light also is distinguished. If the key 110 is turned off when the sound field processor 20 is ON, the frequency scale 104 only is displayed. The state at this time is shown in FIG. 16. Since none of the black triangles 104a is displayed, it is understood that the characteristics are flat.

When the equalizer on-off key 110 has been turned on (it can be also turned on by operation of one of the other keys including keys 112 and 114 associated with the digital equalizer 42), the respective parameters are brought back to the state before the keys was turned off.

(2) Frequency key 112, Q/slope key 114

These are keys for selecting the setting mode. The frequency key 112 is depressed when the center frequencies should be set and the Q/slope key 114 is depressed when Q or the slope should be set. When neither of these keys is depressed, the mode becomes the level setting mode.

(3) Up/down key 116

This is a key for increasing and decreasing the respective set values. the set value increases by depressing the right end portion of the key and decreases by depressing the left end portion of the key.

(4) Low cut key 118

This is a key for setting the low cut characteristics. By depressing this key 118 and then depressing the frequency key 112 and manipulating the up/down key 116, the low cut frequency can be set. By depressing this key 118 and then depressing the Q/slope key 114 and manipulating the up/down key 116, the slope of the low cut frequency can be set.

The low cut key 118 is a toggle type key and switched on and off each time it is depressed. When the key 118 has been turned off, the slope of the low cut frequency becomes flat, the display on the display section 105 disappears and the operation of the up/down key does not become effective. When the key 118 has been turned on from the OFF state, the previous set value is displayed.

(5) Low key 120, middle key 122 and high key 124

These are keys used when characteristics of the three divided bands should be set and correspond to the low, middle and high frequency bands. By depressing the low key 120 and manipulating the up/down key 116, the level of the low frequency is set. By depressing the low key 120 and then depressing the frequency key 112 and manipulating the up/down key 116, the center frequency $f_L$ of the low frequency band is set. By depressing the low key 120 and then depressing the Q/slope key 114 and manipulating the up/down key 116, Q of the low frequency band is set.

The parameters of the middle and high frequency bands can be set in like manner by depressing the middle key 122 and the high key 124 and performing the above described subsequent operations.

(6) High cut key 126

This is a key for setting the high cut characteristics. The high cut frequency and its slope can be set by an operation similar to that of the low cut key 118. When the high cut key 126 has been turned off, the slope of the high cut frequency becomes flat, the operation of the up/down key 116 does not become effective and the display on the display section 108 disappears (the set value before the key 126 is turned off is maintained in the memory).

(11) Sound field effect operation section 130

This is a section performing functions including call-up of the sound field effect program and changing of the parameters. The section 130 includes two display sections 132 and 90 and various operation keys.

The display section 132 displays the sound field effect program number (1-16) of sixteen factory programs (preset programs) stored in the sound field processor 20 (FIG. 2) or sixteen user programs and whether the program is a factory program or a user program. The display section 132 is constructed of an LCD.

The display section 90 displays the name of the called-up program and the set value of the parameter and is constructed of an LCD.

The keys ( all keys are tact switches) of the sound field effect operation section 130 will now be described.

(1) Main mute key 132

This is a key for turning on and off the output of the main signal and is constructed of a toggle type key. When this key 132 is ON, an LED indicator 134 is lighted.

(2) Effect mute key 136

This is a key for turning on and off the output of the sound field effect signal and is constructed of a toggle type key. When this key 136 is OF, an LED indicator 138 is lighted.

(3) Sound field effect on-off key 135

This is a key for turning on and off the processing for creating the sound field effect tone. When this key 135 is ON, the sound field effect tone is created and when it is OFF, the sound field effect tone ceases to be created (the state before turning off of this key is memorized). If this key 135 is turned on from the OFF state (this key can be turned on also by one of other keys including keys 140, 144 and 146 associated with the sound field effect), the state before turning off of this key 135 is restored.

If the digital equalizer 42 is OFF (by operation of the equalizer on/off key 110) when this key 135 is OFF, the display section 90 ceases to display anything whereas if the digital equalizer 42 is ON when the key 135 is OFF, the display section 90 displays "DSP OFF" ("DSP" representing the sound field processor 20).

(4) Parameter selection key 140

This is a key for selecting the kind of parameter when the parameter of the sound field effect is to be changed. Each time this key is depressed, the kind of parameter is selected in a predetermined order. As the parameter of the sound field effect, the following parameters, for example, are prepared:

(a) Room size

This is a parameter corresponding to the size of the room. A larger value represents a larger space. This parameter either expands or contracts the time axis of an initial reflected sound.

(b) Liveness

This is a parameter representing value of attenuating characteristic of the initial reflected sound. As the value of this parameter becomes larger, the attenuating time becomes longer with resulting increase in liveness.

(c) Initial delay

This is a parameter for changing difference in time between start of a direct tone and a reflected sound. This is an important parameter which determines positional relation between the direct tone and the listening point in the sound field. If the value of this parameter becomes small, the listener feels as if he was near the inner wall of the reproduced sound field (e.g., a church) whereas if the value becomes large, he feels as if he was away from the wall. The optimum value is determined depending upon the source, initial reflected sound data and positional relation between the main speakers and the sound field effect speakers. The state of propagation of sound from a sound image on the stage to the surrounding sound field can be controlled by a fine adjustment of this parameter.

(d) High-pass filter

This filter cuts low frequencies at 6 dB/oct. The filter sets frequencies of 32 steps from 0 to 1 kHz.

(e) Low-pass filter

This filter cuts high frequencies at 6 dB/oct. The fitler sets frequencies of 26 steps from 1 kHz to ∞.

(5) Effect level setting mode key 142

This is a key for setting the level of the sound filed effect tone. The key 142 is used for setting balance in the level between the main signal and the sound field effect tone.

(6) Effect front and rear balance setting mode key 144

This is a key for setting balance between front and rear tone volumes of the sound field effect tone.

(7) Up/down key 146

This is a key for increasing or decreasing value of parameter, level of the sound field effect tone and front and rear balance of the sound field effect tone set by the parameter selection key 140, the effect level balance setting mode key 142 and the effect front and rear balance setting mode key 144. For decreasing the set value, the left end portion of the up/down key 146 is depressed and for increasing the set value, the right end portion of the up/down key 146 is depressed.

For example, the parameter selection mode is brought about by operating the parameter selection key 140 and a desired parameter is selected by successively depressing the key 140. By operating the up/down key 146, the value of the selected parameter is set. The effect level setting mode is brought about by operating the effect level setting key 142 and the sound field effect tone level is set by operating the up/down key 146. The effect front and rear balance setting mode is brought about by depressing the effect front and rear balance setting mode key 144 and balance between the front and rear tone volumes of the sound field effect tone is set by operating the up/down key 146.

In setting these modes and values, the display section 90 displays the name of the set mode and the set value. The balance between the front and rear tone volumes is represented by a bar graph and other set values are represented by numerical values.

(8) Title edit key 148

This is a key for setting the name of a user program. By turning on this key 148, a cursor appears in the display section 90 and this cursor moves each time the key 148 is depressed further. The character on the cursor is changed by operating the up/down key 146 and a desired name can be affixed to the program which the user has made. Upon lapse of a certain length of time after this operation or by operating another key, the set program name is stored in a memory and this mode is cleared.

(9) Program key 150

This is a key for selecting one of the sixteen factory programs and sixteen user programs The program key 150 has sixteen keys each of which is assigned with one of the factory programs and one of the user programs. The selected program number is displayed on the display section 132.

(10) Preset key 152

This is a key for calling up the factory program. When this key has been depressed, the program key 150 becomes a key for selecting one of the factory programs. The name of the called up program is displayed on the display section 90.

(11) User program key 154

This is a key for setting the program number in the case of storing a user program or calling up a stored user program. When this key has been depressed, the program key 150 becomes a key for selecting the user program. In storing a user program, the user program is stored at a memory position corresponding to the number depressed by the program key 150 and the user program stored at this number is called up when this number is depressed. The name of the stored or called up program is displayed on the display section 90.

If the user program key 154 is depressed in a state in which a factory program has been selected, a user program which was lastly selected before the factory program is read out.

If the preset key 152 is depressed in a state in which a user program has been selected, the factory program which was lastly selected before the user program is read out.

(12) User program memory key 156

This is a key for storing the user program which is made by calling up a factory program and modifying parameters of the factory program. By turning on of this key 156, the display "PROG. NO." is intermittently lighted and, by subsequently depressing any of the program key 150, the level of the sound field effect, front and rear balance and the name of the user program are stored in combination at this program number (an old user program at the number is deleted). The factory program is a program concerning the sound field effect whereas in the case of the user program, a program concerning the sound field effect and set contents of the digital equalizer 42 at this time are stored in combination. Accordingly, the set contents of the digital equalizer 42 do not change when the factory program has been called up but the set contents of the digital equalizer 42 are called up simultaneously when the user program with which the set contents were stored has been called up.

More specific examples of portions of the circuit shown in FIG. 2 will now be described with reference to FIGS. 8A, 8B and 8C.

[1] FIG. 8A

This is a portion of the circuit including input terminals, output terminals and a selection circuit for an input source and record source output terminals.

The input terminals include five input terminals 17 for digital signals (left and right channel signals are applied on a time shared basis), eleven input terminals 11a (left channel) and eleven input terminals 11b (right channel) respectively for analog signals and four input terminals 61 for video signals. Record source output terminals include two output terminals 50 for digital signals (left and right channel signals are outputted on a time shared basis), six output terminals 38a (left channel) and six output terminals 38b (right channel) respectively for analog signals and two output terminals 62 for video signals.

The respective input sources are connected to these input terminals and record source output terminals as shown in the following table:

| input source | input | | | record output | | |
|---|---|---|---|---|---|---|
| | analog | digital | video | analog | digital | video |
| CD | x | x | | | | |
| VDP1 | x | x | x | | | |
| DAT1 | x | x | | x | x | |
| DAT2 | x | x | | x | x | |
| PHONO AMP | x | | | | | |
| TUNER | x | | | | | |
| TAPE1 | x | | | x | | |
| TAPE2 | x | | | x | | |
| VDP2 | x | x | x | | | |
| VTR1 | x | | x | x | | x |
| VTR2 | x | | x | x | | x |

The analog inputs, digital inputs and video inputs respectively have the following input lines and record output lines:

(1) Analog input lines (a) Input lines

The analog inputs (eleven kinds) for the left channel applied from the analog input terminals 11a are supplied to input selection transistors 162 through buffer amplifiers 160. The input selection transistors 162 receive at their bases a command from a CPU 200 (FIG. 8C) to be described later through a command signal line 164, a decoder 166 and a driver 168. One of the transistors 162 which has been selected by the input selector 74 of the front panel is enabled and the selected analog input is supplied to an analog signal line 170 and applied to the VCA 26 of FIG. 8B to be described later.

The input lines for the right channel analog signals are of the same construction so that illustration thereof is omitted.

(b) Record source output lines

The analog inputs (eleven kinds) for the left channel applied from the analog input terminals 11a are supplied to record source selection transistors 172 through buffer amplifiers 160. The record source selection transistors 172 receive at their bases a command from the CPU 200 through a decoder 174 and a driver 176. One of the transistors 172 which has been selected by depressing the record out key 80 of the front panel and operating the input selector 74 is enabled and the selected analog input is supplied to a signal line 178.

The analog input supplied to the signal line 178 is then supplied to the analog record source output terminals 38a (six) through six transistors 180. The transistors 180 are provided for prohibiting outputting of a signal to an input source which has been selected as the record source. A record source output selection command is inverted by an inverter 182 and thereafter is applied to the bases of the transistors 180 through a driver 184 thereby to supply the record output to the record source output terminals 38a except for the source which has been selected as the record output.

The record source output lines for the right channel analog signals are of the same construction so that illustration thereof is omitted.

(2) Digital input (a) Input lines

Digital inputs (five kinds) applied to the digital input terminals 17 alternately from the left and right channels on a time shared basis are supplied to an input selector 194 through inverters 190 and 192. In accordance with a command (three bits) from the CPU 200, the input selector 194 provides a digital input which has been selected by the input selector 74 of the front panel to a digital I/O receiver 48 of FIG. 8C through a digital signal line 196.

(b) Record output lines

The digital inputs (five kinds) applied to the digital input terminals 17 alternately from the left and right channels on a time shared basis are applied to a digital record source selector 198 through the inverters 190 and 192. In accordance with a command (three bits) from the CPU 200, the digital record source selector 198 supplies a digital input selected by depressing the record out key 80 of the front panel and operating the input selector 74 to two digital source output terminals 50 through inverters 202, output buffers 204 and output transformers 206. Outputting of the digital input to the input source itself is prohibited.

(3) Video Input (a) Input (monitor output) lines

Video inputs (four kinds) applied from the video input terminals 61 are supplied to a selector 208. The selector 208 selects a video input selected by the input selector 74 of the front panel in accordance with a command from the CPU 200 and supplies the selected input to the monitor output 64 through an amplifier 210.

(b) Record source output lines

The video inputs applied to the video input terminals 61 are supplied to a selector 212. In accordance with a command from the CPU 200, the selector 212 selects a video input selected by depressing the record out key 80 of the front panel and operating the input selector 74 and supplies the selected video input to the record source output terminal 62 through amplifiers 214 and 216. Outputting of the selected video input to the input source itself is prohibited.

Figure 8B:
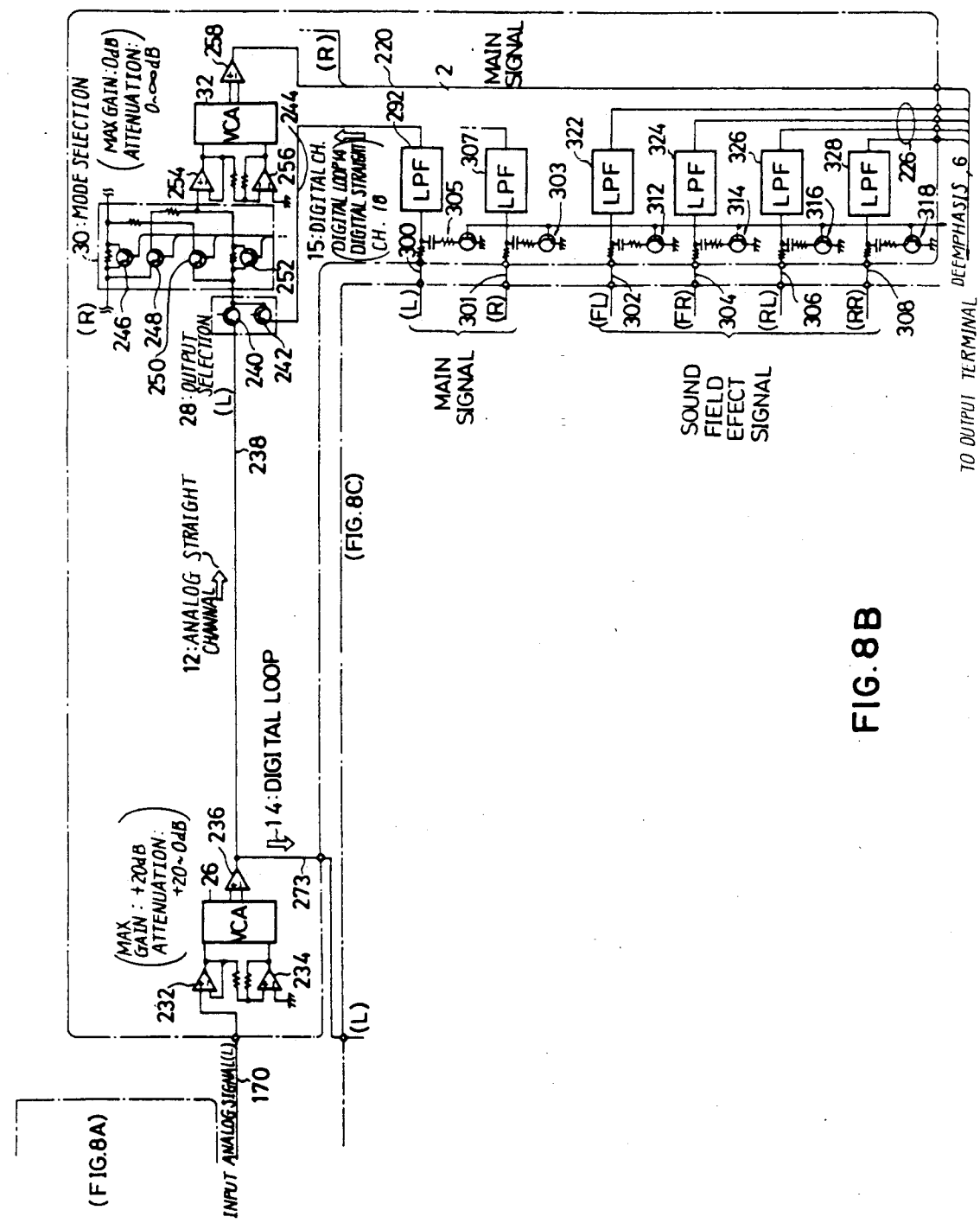
Figure 8C:
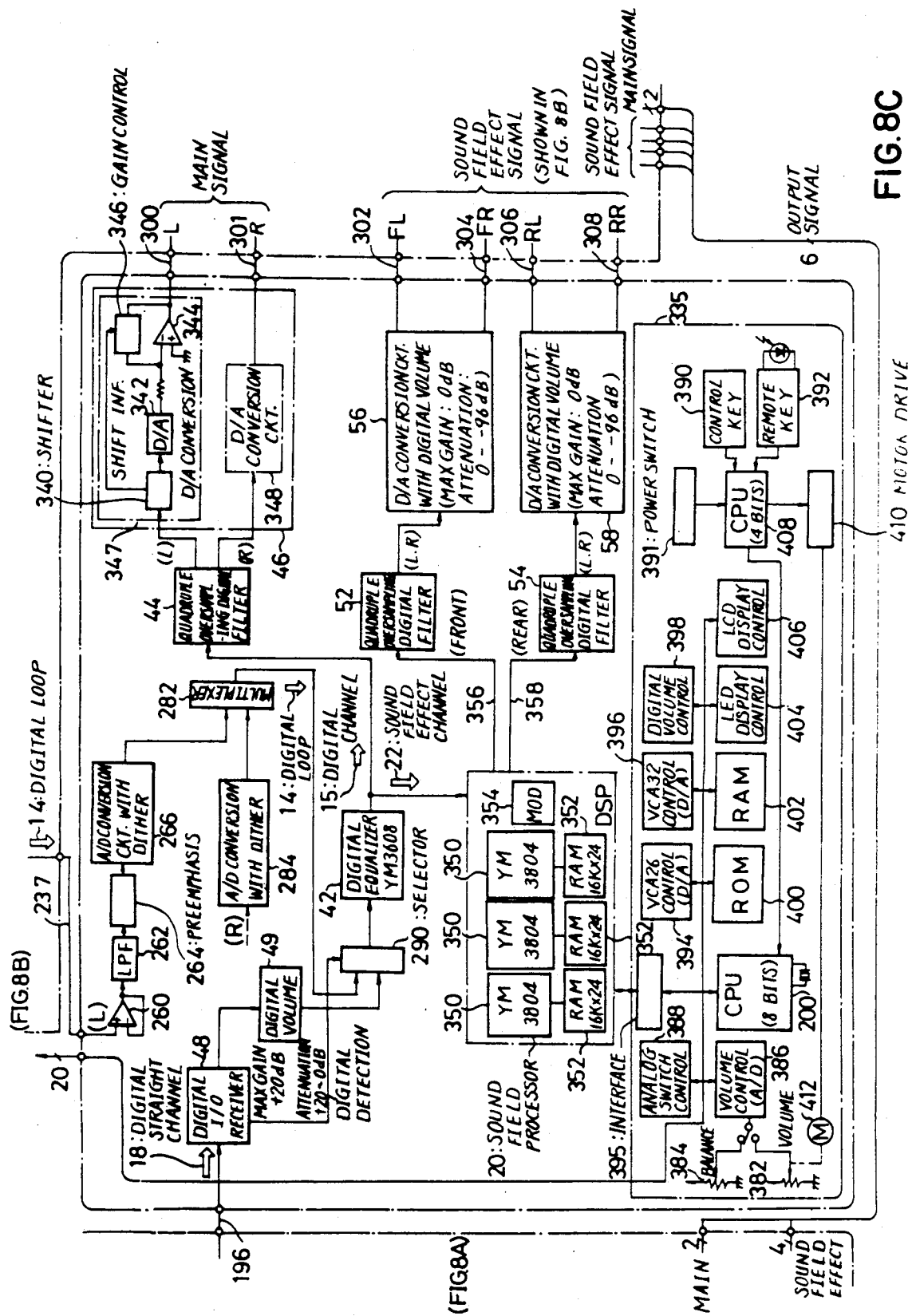

A line 220 is an output line of the main signals from the circuit of FIG. 8B and is connected to the two main signal output terminals 26 through a main mute circuit 222. By operating the main mute key 132 (FIG. 4), the main mute cirucit 222 turns on a transistor 224 and turns off a transistor 226 in accordance with a command from the CPU 200 thereby to apply muting to the main signals.

A line 227 is an output line of the sound field effect signal from the circuit of FIG. 8B. The front tone signal is supplied to the output terminal 60 and the rear tone signal to the output terminal 62 respectively through the line 227 and an effect mute circuit 228. By operating the effect mute key 136 (FIG. 4), the effect mute circuit 228 turns on a transistor 230 and turns off a transistor 232 in accordance with a command from the CPU 200 to apply muting to the sound field effect signal.

[2] FIG. 8B

FIG. 8B relates to output lines of the analog straight channel 12 and other channels. Only one of the left and right analog straight channels is illustrated. The selected analog input signal supplied from the analog signal line 170 of FIG. 8A is applied to amplifiers 232 and 234 in which a signal of in-phase and a signal of opposite phase are produced. The in-phase signal and the opposite phase signal are applied to the VCA 26. The VCA 26 is a balanced voltage-controlled amplifier receiving a signal of one phase and a signal of opposite phase for amplification. The VCA 26 is variably controlled within the range of maximum gain of +20 dB and the amount of attenuation between +20 dB and 0 dB. The output of the VCA 26 is outputted through a differential amplifier 236 and supplied to a line 237 of the digital loop 14. The output of the VCA 26 is applied also to the output selection circuit 28 through an analog signal line 238.

The output selection circuit 28 selects whether the analog straight channel 12 should be used or the digital channel (i.e., the digital loop 14 or the digital straight channel 18) should be used. The output selection circuit 28 effects this selection by turning on and off transistors 240 and 242 in accordance with a command from the CPU 200.

In a case where an analog input has been selected as the input source and the function of the digital equalizer 42 is in an off state by operation of the equalizer on/off key 110, the transistor 240 is ON and the transistor 242 is OFF so that the analog straight channel 12 is employed to output the analog output.

In a case where an analog input has been selected as the input source and the equalizer on/off key 110 is ON, the transistor 240 is OFF and the transistor 242 is ON so that a signal which has been subjected to digital processing through the digital loop 14 and thereafter converted to an analog signal is outputted through a line 244 and the transistor 242.

In a case where a digital input has been selected as the input source or a case where an input source which outputs both an analog signal and a digital signal (e.g., DAT, CD and VDP) has been selected, the transistor 240 is OFF and the transistor 242 is ON and the signal which has been supplied from the digital straight channel 18 or the signal which has been processed through the digital loop 14 and thereafter converted to an analog signal is outputted through the line 244 and the transistor 242.

The output of the output selection circuit 28 is applied to the mode selection circuit 30. The mode selection circuit 30 switches the mode between the stereophonic mode and the monaural mode in accordance with a command from the CPU 200 by operating the mode key 86.

In the stereophonic mode, transistors 246 and 252 of the mode selection cirucit 30 are ON and transistors 248 and 250 of the circuit 30 are OFF so that the signals of the left and right channels are separately outputted. In the monaural mode, the transistors 246 and 252 are OFF and the transistors 248 and 250 are ON so that the signals of the left and right channels are outputted after being added together in resistance.

The signals from the mode selection circuit 30 are applied to amplifiers 254 and 256 in which a signal of in-phase and a signal of opposite phase are produced. These signals are supplied to the VCA 32. The VCA 32 is a balanced voltage-controlled amplifier receiving a signal of in-phase and a signal of opposite phase for amplification and is variably controlled within the range of maximum gain of 0 dB and the amount of attenuation between 0 and $\vee$. The output of the VCA 32 is outputted through a differential amplifier 258 and supplied to the main signal output terminal 26 of FIG. 8A through the output line 220.

In FIG. 8B, a line 300 is an output line for the main signal (left channel) after digital-to-analog conversion in the digital channel. An input signal (an analog signal) applied to this line 300 is supplied to the output selection circuit 28 through a deemphasis circuit 305 and an LPF 292.

A line 301 is an output line for the main signal (right channel) after digital-to-analog conversion in the digital channel. An input signal (an analog signal) applied to this line 301 is supplied to the output selection circuit of the right channel (not shown) through a deemphasis circuit 303 and an LPF 307.

Lines 302, 304, 306 and 308 are output lines for sound field effect signals, receiving respectively the front left, front right, rear left and rear right signals. The respective sound field effect signals applied to these lines 302, 304, 306 and 308 are delivered to the line 226 through deemphasis circuits 312, 314, 316 and 318 and LPFs 322, 324, 326 and 328 and thereafter are supplied to the sound field effect output terminals 60 (for the front loudspeakers) and 62 (for the rear loudspeakers).

(3) FIG. 8C

FIG. 8C includes the digital loop 14 of the analog input, the digital straight channel 18, the sound field effect channel 22 and a control circuit 335.

An analog signal applied to a line 237 of the digital loop 14 is supplied to an analog-to-digital conversion circuit 266 having a dither circuit through a buffer amplifier 260, a low-pass filter 262 and a preemphasis circuit 264.

Figure 13:
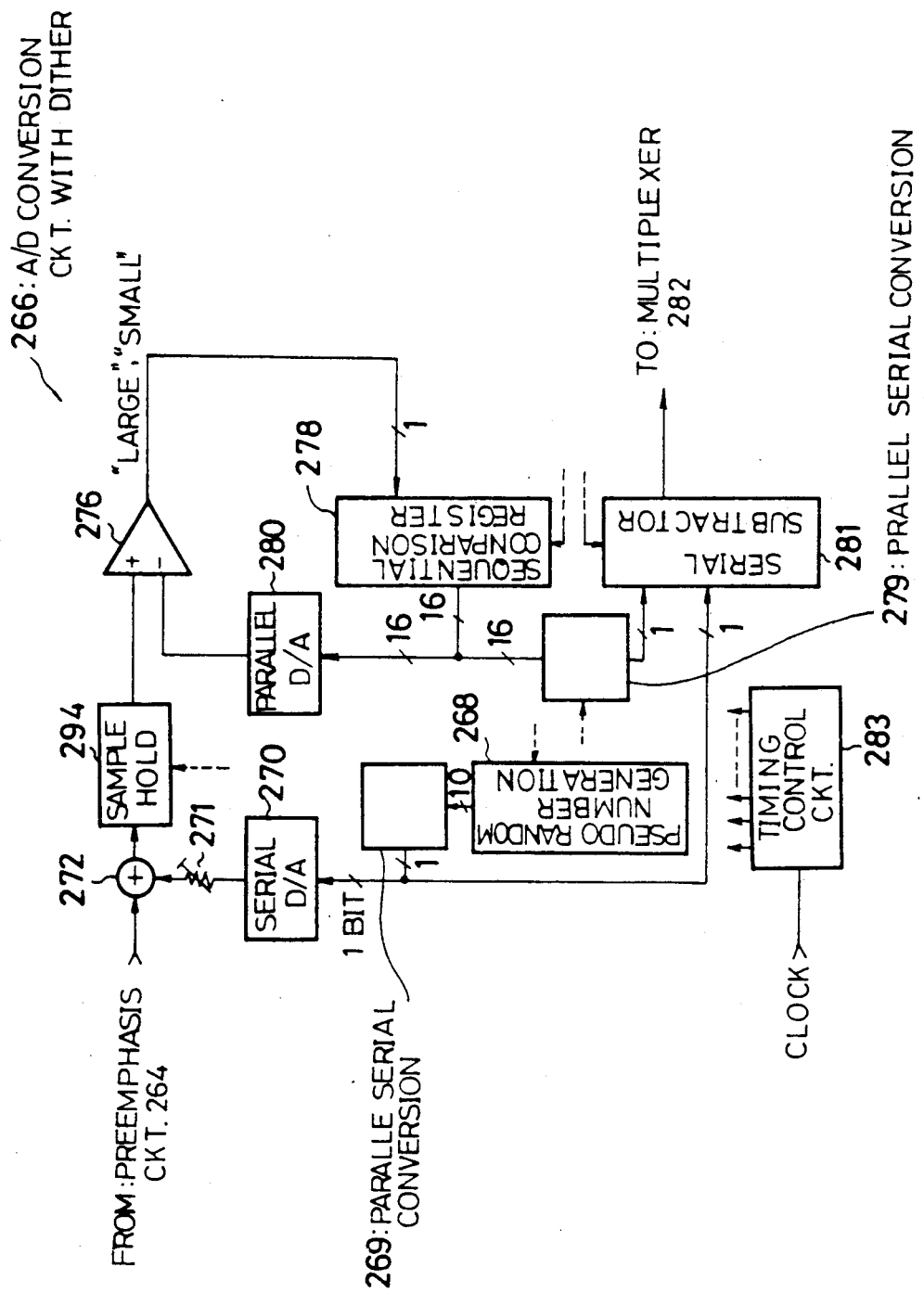
FIG. 13 is a block diagram showing an example of construction of a digital-to-analog conversion circuit 266 with dither in FIG. 8C.

A specific example of the analog-to-digital conversion circuit 266 is shown in FIG. 13. This circuit performs a sequential comparison type analog-to-digital conversion.

In the circuit of FIG. 13, a pseudo-random-number generator 268 generates a noise used for dither in the form of a digital signal. This noise is converted to an analog signal by a serial digital-to-analog converter 270 through a parallel-serial converter 269. The converted signal is supplied to an adder 272 through an attenuator 271 and is added to the input signal from the preemphasis circuit 264. The sum signal is applied to a comparator 276 through a sample hold circuit 294. The output of a sequential comparison register 278 is supplied to a comparator 276 through a parallel digital-to-analog converter 280.

The comparator 276 sequentially compares the two inputs. If the input from the sample hold circuit 294 is larger, the comparator 276 provides "1" as its bit output and, if the input from the sample hold circuit 294 is smaller, the comparator 276 provides "0" as its bit output. This operation by the comparator 276 is repeated to LSB (the least significant bit). Digital data corresponding to the output of the sample hold circuit 294 is thereby held in the sequential comparison register 278.

The data held in the sequential comparison register 278 is supplied to a serial subtractor 281 through a parallel-to-serial converter 279 and a signal from which the noise has been subtracted is outputted from the serial subtractor 281. By performing this operation each time a signal is held by the sample hold circuit 294, a digital signal corresponding to the output analog signal (left channel) of the preemphasis circuit 264 is provided by the serial subtractor 281.

A timing control circuit 283 is a circuit for controlling timings of the respective portions of the circuit.

Reverting to FIG. 8C, an analog-to-digital conversion circuit 284 converts an input analog signal applied to the digital loop of the right channel (not shown) to a digital signal. The circuit 284 is constructed in the same manner to the analog-to-digital conversion circuit 266 of FIG. 13.

Output digital signals of the analog-to-digital conversion circuits 266 and 284 are time-division multiplexed by a multiplexer 282.

A digital signal applied to the signal line 196 of the digital straight channel 18 is supplied to the digital I/O receiver 48.

As was described previously, the digital I/O receiver 48 is a circuit for interfacing the input digital signal with the post stage circuit.

The output of the digital I/O receiver 48 is supplied to the digital volume 49. The digital volume 49 corresponds to the VCA 26 in the analog channel (FIG. 8B) and adjusts the level of the digital signal.

The digital signal of the digital loop 14 and the digital signal of the digital straight channel 18 are applied to a selector 290. When a signal arrives from the digital loop 14 only, the selector 290 outputs this signal whereas when a signal arrives from the digital straight channel 18 only, the selector 290 outputs this signal. When signals of the same source arrive from both the digital loop 14 and the digital straight channel 18, the selector 290 outputs the signal from the digital straight channel 18. Alternatively stated, when there is a digital input source of a higher quality, the selector 290 preferentially outputs a signal from such input source of a higher quality. If a data error has been detected in the digital I/O receiver 48 when an analog input from the same source is being applied simultaneously, the selector 290 outputs a signal from the digital loop channel 14.

As specific manners of selecting a channel by the digital I/O receiver 48, there can be the following manners:

(a) Change in voltage (i.e., change between "1" and "0") in the digital straight channel 18 is watched and the digital straight channel 18 is selected when there has been a change.

(b) If it is desired to perform the selection more accurately, the basic period (i.e., sampling period f of voltage change (between "1" and "0") in the digital straight channel 18 is detected and, when a period corresponding to this basic period has been detected, the digital straight channel 18 is selected.

(c) Whether the internal PLL is synchronized or not is detected. Even when a signal is supplied to the digital straight channel 18, if the internal PLL is not synchronized for some reason (dropout, disorder etc.), the digital loop 14 is selected. When there is an data error, the digital loop 14 also is selected.

The output of the selector 290 is applied to the digital equalizer 42.

The digital equalizer 42 is a processor for performing digital filtering as described above and is constructed of a three-band parametric equalizer. In accordance with setting in the digital equalizer parameter setting section 100 and a command from the CPU 200, the center frequency, Q and level of each of the three divided bands are set to the set values. The low cut and high cut frequencies and their slopes are also set to their set values by changing the filter construction or filter coefficients in accordance with a command of the CPU 200. A digital signal applied to the digital equalizer 42 is imparted with a set filter characteristic. As the digital equalizer 42, a digital equalizer YM3608 manufactured by Nippon Gakki Seizo Kabushiki Kaisha for example may be employed.

The output of the digital equalizer 42 is supplied to the quadruple oversampling digital filter 44 as the main signal.

The quadruple oversampling digital filter 44 is provided for alleviating load imposed on the LPF 292 (FIG. 8B) after digital-to-analog conversion in the post stage circuit. This filter 44 applies quadruple oversampling (i.e., inserting three interpolation data in one sampling period of the input source and thereby shifting sampling noise to the high frequency side) to input digital data and thereafter outputs the digital data.

The quadruple oversampling digital filter 44 prevents accumulation of error occurring in convolution operation by performing the convolution operation with high accuracy with respect to the sixteen bit input (Details of this method are described in Japanese Patent Application No. 231060/1986 filed on Sept. 29, 1986). Since an operation of high accuracy is performed by the digital-to-analog conversion circuit 46 in the post stage circuit, the digital filter 44 outputs a signal of eighteen bits. This eighteen bit signal is applied to the digital-to- analog conversion circuit 46.

Responsive to the eighteen bit signal, the digital-to-analog conversion circuit 46 performs digital-to-analog conversion with high accuracy. For example, a musical tone signal of CD is not of a constant level but changes dynamically. Although a digital-to-analog converter in CD generally has a conversion capacity of sixteen bits from MSB to LSB, the MSB and some adjacent bits thereto sometimes are not used in a digital signal coding an actual musical tone. In converting such digital signal, therefore, the digital-to-analog converter operates actually with fifteen bits or less bits in spite of the fact that it has the conversion capacity of sixteen bits with a result that distortion and noise of the digital-to-analog converter become conspicuous when the signal is of a small level. In the digital-to-analog conversion circuit 46 which receives the eighteen bit signal, therefore, the signal is shifted up up to two bits when the level of the signal is small so that the digital-to-analog conversion is performed in a section in which distortion is small and linearity of a digital-to-analog converter 342 is good. After the digital-to-analog conversion, adjustment of the level is made by decreasing gain of an analog amplifier 344 in the post stage circuit by an amount corresponding to the shift-up (e.g., ¼ attenuation when two bit shift-up has been made). Besides, by making the shift-up, all of the eighteen bit output of the digital filter 44 can be used so that a requantizing noise (i.e., an accumulated error in the convolution operation in the digital filter 44 in the former stage) can be reduced to ¼.

In the digital-to-analog conversion circuit 46, the left channel signal produced by the digital filter 44 is applied to a shifter 340 and, after being shifted up up to two bits in accordance with the amplitude level of the signal, is converted to an analog signal by the digital-to-analog converter 342. The output analog signal of the digital-to-analog converter 342 is applied to a variable amplifier 344. The gain of the variable amplifier 344 is reduced by a gain control circuit 346 by an amount corresponding to the shifted up bits (there is no gain in the digital-to-analog conversion circuit 46 as a whole). By this arrangement, an analog signal which corresponds accurately to the output of the digital filter 44 is outputted from the line 300 as the left channel main signal.

Figure 15:
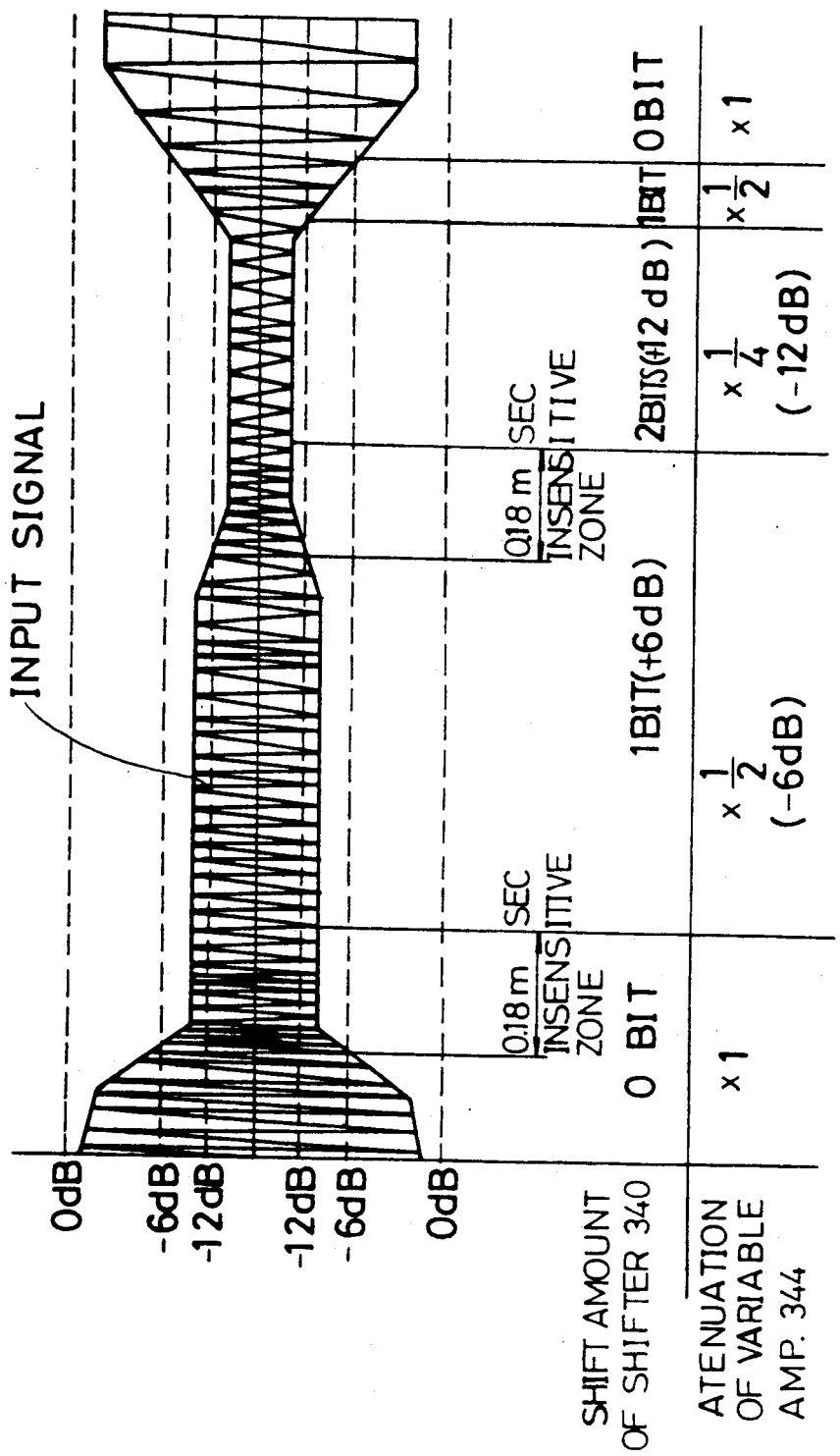
FIG. 15 is a diagram for explaining the operation of a digital-to-analog conversion circuit 46 in FIG. 8C.

FIG. 15 shows operation of the digital-to-analog conversion circuit 46. The shifter 340 constantly detects the input signal level and, upon confirming that the level has dropped to a region of −6 dB, performs shifting up by one bit (+6 dB) after lapse of 0.18 second which is provided as an insensitive zone. The variable amplifier 344 attenuates the level by −6 dB. Similarly, if the shifter has confirmed that the level has dropped to a region of −12 dB, it performs shifting up by another one bit (+12 dB) after lapse of 0.18 second. In this case, the variable amplifier 344 attenuates the level by −12 dB.

In case the input signal level increases, no insensitive zone is provided.

A digital-to-analog conversion circuit 348 for the right channel main signal is constructed in the same manner as the digital-to-analog conversion circuit 347 for the left channel.

Description will now be made about creation of the sound field effect tone.

The output of the digital equalizer 42 is provided on the sound field effect channel 22 for creation of the sound field effect tone and supplied to the sound field processor 20 (depending upon the program, a signal of (left channel + right channel)/2 or left channel and right channel signals are applied).

The sound field processor 20 includes three sets of processors 350 (e.g., YM3804, also called DSP, manufactured by Nippon Gakki Seizo Kabushiki Kaisha) and signal delay memories 352 of 24 bits × 16 k words (e.g., made of a dynamic RAM) for handling respectively signal processing of the front tones, rear tones and tones common to the front and rear loudspeakers and creates the sound field effect tone in accordance with the program selection operation and parameter changing operation in the sound field effect operation section 130 in the front panel. The front tone of the created sound field effect tone is outputted from a line 356 and the rear tone is outputted from a line 358 (the left and right channel tones are outputted on a time shared basis).

A modulation circuit 354 is provided for imparting the sounded tone with other sound field effect such as chorus, tremolo and symphonic effects. These sound field effects are programs which are artificially produced without using data of actually reflected sounds and various interesting effects can be produced by utilizing these sound field effects. These sound field effects include, for example, a delay effect according to which tones of four channels are delayed slightly from one another to produce a stereophonic sound, a stereo echo effect which produces an echo effect by slightly shifting the left channel sound from the right channel sound, a stereo flange effect according to which a surging effect is produced while the tone quality is being changed, a chorus effect which gives an impression of sway of sound as if the sound was drifting, a stereo phasing effect which imparts a unique sound accompanied by feeling that the sound is rolling, a tremolo effect which creates exquisite sway of sound, a symphonic effect which creates lyrical and brilliant harmony of sounds and an echo room effect according to which one feels as if he was in an echo room of a recording studio.

The front tone signals of the left and right channels which are provided from the line 356 on a time shared basis are subjected to quadruple oversampling by the digital filter 52 and supplied to the digital-to-analog conversion circuit 56 in eighteen bits.

The digital-to-analog conversion circuit 56 includes a digital volume and a digital-to-analog converter and converts an input digital signal to an analog signal and imparts the signal with a gain to be set which is determined by the CPU 200 (determined in 480 stages, i.e., within the range between 0 dB and −96 dB as shown in FIG. 10) in accordance with operation of the tone volume adjusting means such as a volume, balance and muting.

Figure 14:
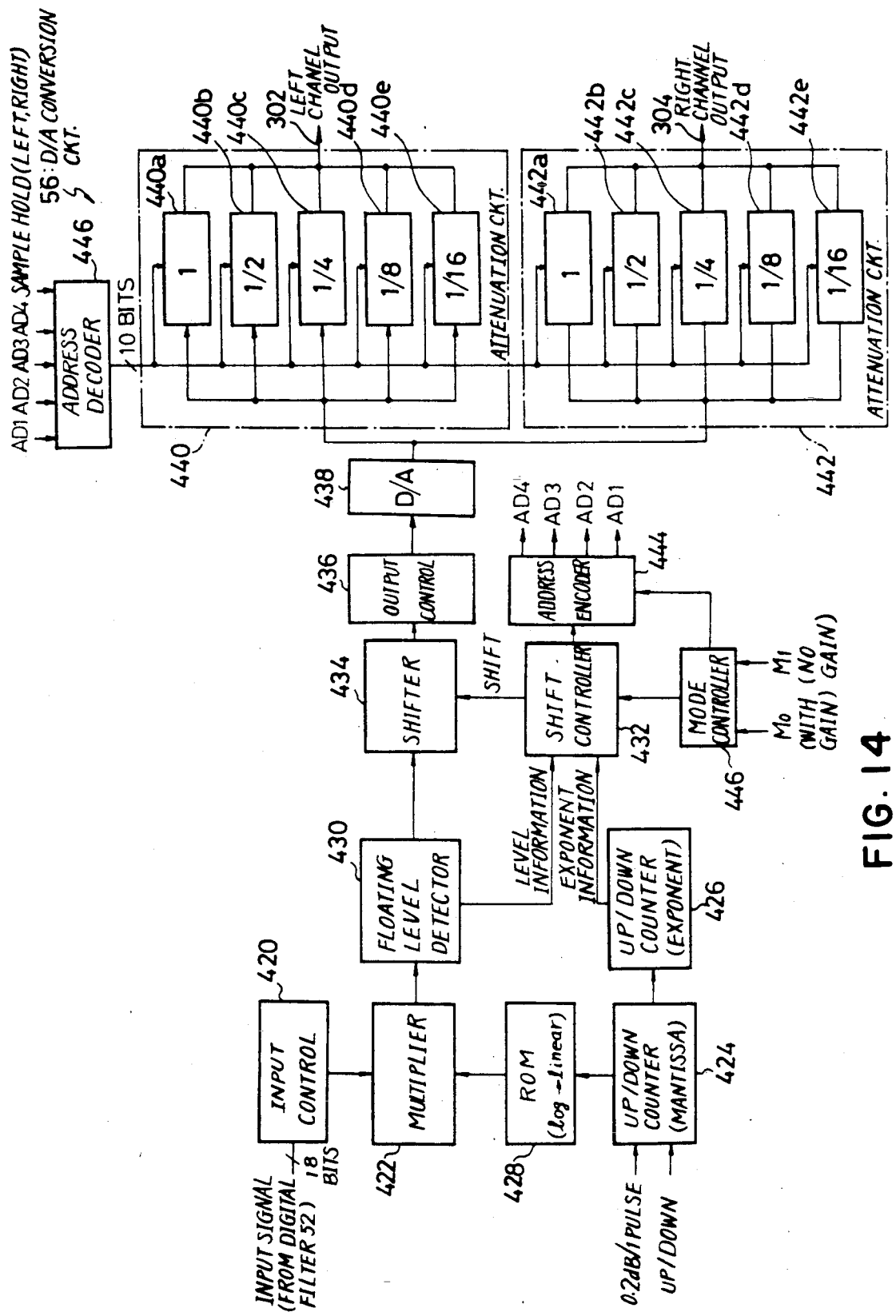
FIG. 14 is a block diagram showing an example of construction of a digial-to-analog conversion circuit 56 in FIG. 8C.

A specific example of the digital-to-analog conversion circuit 56 is shown in FIG. 14.

The input signal (the left and right channel signals are applied on a time shared basis) is supplied to a multiplier 422 through an input control circuit 420. The gain information from the CPU 200 contains up/down information which indicates whether the gain is increasing or decreasing and amount of change which is given as pulses each of which represents 0.2 dB.

This pulse and up/down information are given to an up/down counter 424 in which the pulse is counted up or down. The up/down counter 424 produces one shot of pulse with up information or down information each time the counter 424 overflows or underflows thereby causing an up/down counter 426 to count up or down.

By this operation, the gain information is held by the up/down counters 424 and 426 in such a manner that mantissa portion of the gain information is held by the up/down counter 424 and exponent portion thereof by the up/down counter 426.

The mantissa held by the up/down counter 424 is logarithm-to-linear converted by a ROM 428 and thereafter is multiplied with the input signal.

The output signal of the multiplier 422 is supplied to a shifter 434 and its level is detected by a floating level detector 430. When the level of the output signal of the multiplier 422 is small, a shift controller 432 drives the shifter 434 to shift up the output of the multiplier 422 up to two bits in a similar manner to the operation of the shifter 340 in the channel of the main signal.

The output of the shifter 434 is supplied to a digital-to-analog converter 438 through an output control circuit 436. The output analog signal of the digital-to-analog converter 438 is supplied to attenuation circuits 440 and 442.

The attenuation circuit 440 includes attenuators 440a through 440e (each having a sample hold circuit) having respectively amounts of attenuation of 1 (through), ½, ¼, ⅛ and 1/16 and receives both the left and right channels. The attenuation circuit 442 has the same construction as the attenuation circuit 440 with attenuators 442a through 442e.

The shift controller 432 subtracts the amount of shift in the shifter 434 from the exponential value of the gain information provided by the up/down counter 426 to obtain an amount of attenuation necessary for realizing gain which has been commanded by the CPU 200. An address encoder 444 outputs this attenuation amount information.

The attenuation amount information is supplied through an address decoder 446 to the attenuation circuits 440 and 442 in the form of a sampling pulse. This causes the output of the digital-to-analog converter 438 to be sample-held by some of the attenuators 440a through 440e and 442a through 442e which corresponds to the attenuation amount information (the left and right channel signals are separated by this sample holding) to provide a necessary amount of attenuation. Thus, an analog signal which is the input signal imparted with a certain gain is outputted.

As described in the foregoing, by dividing the gain information into mantissa portion and exponent portion and first multiplying the input digital signal with the mantissa portion only before digital-to-analog conversion and then multiplying the analog output with the exponent portion, the word length of the digital-to-analog converter 438 can be effectively utilized and a digital volume with reduced error can thereby be realized. The bit shifting by the shifter 434 contributes also to reduction of error in the digital-to-analog converter 438.

The left and right channel outputs of the attenuators 440 and 442 are supplied to the LPFs 322 and 324 of FIG. 8B through lines 102 and 304 of FIG. 8C.

A mode controller 448 in the digital-to-analog conversion circuit 56 in FIG. 14 is provided for switching the operation mode of this digital-to-analog conversion circuit 56. In other words, the digital-to-analog conversion circuit 56 in FIG. 14 can be used as the digital-toanalog conversion circuit of the main signal (FIG. 8C). In that case, the multiplier 422 is made ineffective and the shift controller 432 is constructed not to receive the exponential information from the up/down counter 426. By this modification, the digital-to-analog conversion circuit 56 ceases to have gain and the operations of bit-shifting, digital-to-analog conversion and attenuation only are performed so that the digital-to-analog conversion circuit 56 can be utilized as the digital-to-analog conversion circuit 46. Setting of this mode is made by mode switching commands M1 and M2 supplied from the CPU 200.

In FIG. 8C, the rear tone signal provided from the sound field processor 20 to a line 358 (the left and right channel signals are supplied on a time shared basis) are subjected to quadruple oversampling by the digital filter 54 and thereafter is supplied to a digital-to-analog conversion circuit 58. The digital-to-analog conversion circuit 58 is constructed in the same manner as the above described digital-to-analog conversion circuit 56 of FIG. 14. The left and right channel sound field effect signals outputted from the digital-to-analog conversion circuit 58 are supplied through lines 306 and 308 to LPFs 326 and 328 of FIG. 8B.

A control circuit 335 controls respective portions of this amplifier. In the control circuit 335, a variable resistor 382 is interlocked with the main volume 94 and produces dc voltage corresponding to the amount of rotation of the main volume 94. A variable resistor 384 is interlocked with the balance adjusting volume 96 and produces dc voltage corresponding to the amount of rotation of the volume 96. These dc voltages are converted to digital signals by a volume control circuit (analog-to-digital converter) 386 and thereafter are supplied to the CPU 200.

A CPU 408 receives on/off information 391 of the power switch 70, control key information 390 of the various control keys of the front panel and remote control information 392 and supplies contents of operation of these switches and keys to the CPU 200.

In accordance with the contents of operation, the CPU 200 on-off controls the analog switches of the respective circuits through an analog switch control circuit 388. The CPU 200 also comprehensively judges contents of operations of the respective tone volume adjusting means (main volume 94, left and right balance volume 96, audio muting key 92, input level setting key 88, main mute key 132, effect mute key 136, sound field effect level setting mode key 142 and effect front and rear balance setting mode key 144) and thereupon computes the gain distribution of the respective tone volume adjustment control means (VCAs 26 and 28, digital volume 48 and digital volumes of the digital-to-analog conversion circuits 56 and 58) and controls gains of the respective tone volume adjustment control means through a control circuit 394 for the VCA 26, a control circuit 396 for the VCA 32 and the digital volume control circuit 398.

The CPU 200 also transmits information representing contents of the various operations to LED-LCD display control circuits 404 and 406 for displaying these contents on the respective LED and LCD indicators.

The CPU 200 also controls the sound field processor 20 through an interface 395.

A ROM 400 stores information including sound field effect factory programs. A RAM 402 stores information including programs which are combinations of sound field effect user programs and set contents of the digital equalizer 42, set values of input level and current set states of the respective parts. These stored data are not erased if the power switch is turned off. A motor drive 410 drives the main volume 94 by a stepping motor 412 in accordance with a remote control operation.

What is claimed is:

1. An input level adjusting circuit comprising:
input selection means for selecting one of input signals from plural input sources and outputting the selected signal and also outputting information concerning the selected input signal;
level adjusting means connected to said input selection means for adjusting the level of the selected input signal in accordance with a command value substantially uniformly for all frequencies to provide a level-adjusted output;
memory means for prestoring input level setting offset amounts which are relative differences in an amount of level adjustment for said plural input sources; and
control means responsive to the information concerning the selected input signal supplied from said input selection means for reading out one of the input level setting offset amounts for the corresponding input source and controlling said level adjusting means in accordance with a single value determined from both the command value and the read out input level setting offset amount, wherein the offset amounts can be set to compensate for differences in levels of signals from each of the plural input sources so that substantially the same level is output from said level adjusting circuit in response to selection of any input source for a given command value.

2. An input level adjusting circuit as defined in claim 1 which further comprises a main tone volume setting operation for setting said command value.

3. An input level adjusting circuit as defined in claim 2 which further comprises an offset setting operator wherein when the respective input sources are changed from one input source to another, said offset setting operator may be operated so as to determine an offset amount in the input level of each of said input sources and this offset amount can be stored in said memory means.

4. An input level adjusting circuit as defined in claim 2 wherein said main tone volume setting operator is operated to determine an offset amount in the input level of each of said input sources and this offset amount is stored in said memory means.

5. An input level adjusting circuit as defined in claim 1 wherein said control means is a CPU and said level adjusting means is a digital volume control means.

6. An input level adjusting circuit as defined in claim 1 in which said control means is a CPU and said level adjusting means is a VCA and which further comprises digital-to-analog conversion means provided between said CPU and said VCA.

* * * * *